(12) United States Patent
Nomura et al.

(10) Patent No.: US 6,927,274 B2
(45) Date of Patent: Aug. 9, 2005

(54) RESIN COMPOSITIONS, PROCESSES FOR PREPARING THE RESIN COMPOSITIONS AND PROCESSES FOR FORMING RESIN FILMS

(75) Inventors: Mamiko Nomura, Kanuma (JP); Masatoshi Hasegawa, Chiba (JP); Junichi Ishii, Kanuma (JP); Tadashi Akamatsu, Kanuma (JP)

(73) Assignee: Sony Chemicals Corp. (JP)

( * ) Notice: Subject to any disclaimer, the term of this patent is extended or adjusted under 35 U.S.C. 154(b) by 0 days.

(21) Appl. No.: 10/693,842

(22) Filed: Oct. 24, 2003

(65) Prior Publication Data

US 2004/0127595 A1 Jul. 1, 2004

Related U.S. Application Data

(63) Continuation of application No. PCT/JP02/03807, filed on Apr. 17, 2002.

(30) Foreign Application Priority Data

Apr. 24, 2001 (JP) ........................................ 2001-125585

(51) Int. Cl.$^7$ ......................... C08G 73/10; C08L 79/08; C08J 3/28; C08K 5/00
(52) U.S. Cl. ........................ 528/170; 528/125; 528/126; 528/128; 528/172; 528/173; 528/176; 528/179; 528/183; 528/188; 528/220; 528/229; 528/350; 528/351; 528/353; 430/170; 430/193; 430/270.1; 430/281.1; 430/283.1; 430/330; 525/432; 525/436; 522/136; 522/139; 522/140; 522/164
(58) Field of Search ................................. 528/125, 126, 528/128, 170–173, 176, 179, 183, 188, 220, 229, 350, 351, 353; 525/432, 436; 522/136, 139, 140, 164; 430/170, 193, 270.1, 281.1, 330; 428/473.5

(56) References Cited

U.S. PATENT DOCUMENTS

| 4,942,108 A | | 7/1990 | Moreau et al. ............. 430/169 |
| 5,238,784 A | * | 8/1993 | Tokoh et al. ............ 430/283.1 |
| 5,346,806 A | * | 9/1994 | Pawlowski et al. ...... 430/284.1 |
| 5,397,682 A | * | 3/1995 | Matsuoka et al. ....... 430/283.1 |
| 5,449,588 A | * | 9/1995 | Maeda et al. ............. 430/270.1 |
| 6,600,006 B2 | * | 7/2003 | Jung et al. .................. 528/353 |

FOREIGN PATENT DOCUMENTS

| EP | 1 037 112 A1 | 9/2000 | ........... G03F/7/039 |
| JP | 62-135824 | 6/1987 | ............. G03C/1/72 |
| JP | 6-73003 | 3/1994 | ....... C07D/207/452 |
| JP | 08-044062 | * 2/1996 | |
| JP | 11-153868 | 6/1999 | ........... G03F/7/039 |
| JP | 11-338143 | 12/1999 | ........... G03F/7/037 |
| JP | 2000-199958 | 7/2000 | ........... G03F/7/037 |
| JP | 2000-330297 | 11/2000 | ............. G03F/7/32 |

OTHER PUBLICATIONS

PCT Notification of Copies of Translation of the International Preliminary Examination Report dated Dec. 8, 2003, 5 pages.

* cited by examiner

*Primary Examiner*—P. Hampton Hightower
(74) *Attorney, Agent, or Firm*—Osha Liang L.L.P.

(57) ABSTRACT

Polyimide precursors contained in resin compositions of the present invention have a polymer structure unit represented by formula (1) below:

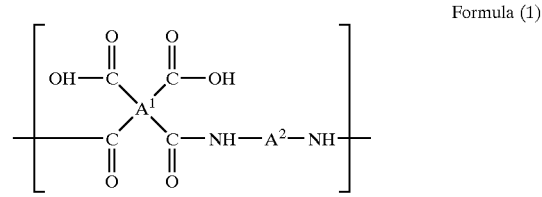

Formula (1)

wherein chemical structure $A^2$ includes an alicyclic compound but not an aromatic compound such as a benzene ring so that they provide excellent light transmission over a wide wavelength range. The polyimide precursors are imidized at 7.5% or more and 36% or less so that they are less soluble in developing solutions and therefore are not dissolved in the developing solutions at unexposed parts. Thus, the resin compositions of the present invention can be used to form a resin film having a precise pattern by exposure and development.

7 Claims, 13 Drawing Sheets

RESIN COMPOSITIONS, PROCESSES FOR PREPARING THE RESIN COMPOSITIONS AND PROCESSES FOR FORMING RESIN FILMS

This Application is a continuation of PCT/JP02/03807, filed Apr. 24, 2001, and claims the benefit under 35 U.S.C. §120 of that application. In addition, that application is expressly incorporated by reference in its entirety.

TECHNICAL FIELD

The present invention relates to the field of wiring boards having a resin film, particularly the technique of patterning a resin film on a metal wiring.

BACKGROUND ART

Polyimide resins obtained by heating a resin composition containing a polyimide precursor to imidize it have been widely used as insulating films (resin films) in semiconductors and circuit boards.

In recent years, attempts have been made to pattern a resin film consisting of a photosensitive polyimide resin by exposure, but it is difficult to pattern widely used aromatic polyimides by exposure because they are significantly colored by intramolecular conjugation and charge transfer complexation so that they have very low light transmittances over a wide wavelength range from UV to visible regions.

Polyimide precursors before imidization have higher light transmittances than after imidization. However, resin films having a film thickness of 10 μm or more as used in circuit boards cannot be precisely patterned with g rays (wavelength 436 nm) or i rays (wavelength 365 nm) commonly used for patterning because of the insufficient light transmittances of precursors of aromatic polyimides.

Moreover, polyimide precursors are more soluble in developing solutions than polyimide resins so that not only exposed parts but also unexposed parts may be dissolved during the developing step. In any event, it was difficult to precisely pattern resin films consisting of polyimide resins by exposure and development.

The present invention was made to overcome the disadvantages of the prior art described above with the purpose of providing a resin composition from which a precisely patterned film can be formed even when it has a large thickness.

DISCLOSURE OF THE INVENTION

First of all, the imidization degree of polyimides used as essential features of the present invention is explained.

Polyimide precursors having a polymer structure unit represented by formula (1) below have no imide ring in their chemical structure, but form an imide ring via ring closure by dehydration when they are imidized. In formula (1), the chemical structure of $A^2$ remains unchanged before and after imidization.

We were interested in the change in the chemical structure after imidization as described above and defined the extent of imidization (imidization degree) of a polyimide precursor having a polymer structure unit of formula (1) by equation (a) below:

Imidization degree (%)=$(PS_1/PS_2)/(PI_1/PI_2) \times 100$ wherein $PS_1$ and $PS_2$ represent the absorbances of the polyimide precursor as analyzed by FT-IR (Fourier transform infrared spectroscopy) and $PI_1$, and $PI_2$ represent the absorbances of the polyimide precursor after complete imidization (polyimide) as analyzed by FT-IR, and $PS_1$ and $PI_1$ represent the absorbances derived from the imide ring and $PS_2$ and PI2 represent the absorbances derived from chemical structure $A^2$ in formula (1).

As used herein, not only polyimide precursors having an imidization degree of 0% but also polyimide precursors having an imidization degree of 36% or less are referred to as polyimide precursors.

On the basis of the finding above, the present invention provides a resin composition containing an imidized polyimide precursor having a polymer structure unit represented by formula (1) below:

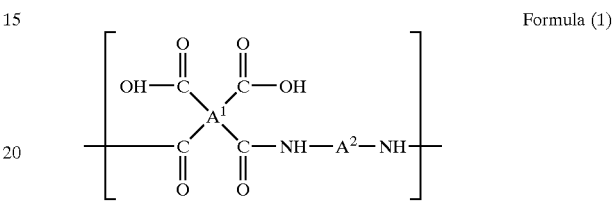

Formula (1)

wherein the chemical structure represented by $A^1$ includes an aromatic compound and the chemical structure represented by $A^2$ includes an alicyclic compound, and a photosensitizer, wherein the chemical structure represented by $A^1$ in formula (1) above is biphenyl represented by chemical formula (2) below:

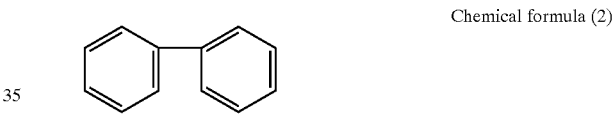

Chemical formula (2)

and the chemical structure represented by $A^2$ in formula (1) above is an alicyclic compound selected from either one of cyclohexane represented by chemical formula (3) below:

Chemical formula (3)

or 4,4'-methylenebiscyclohexane represented by chemical formula (4) below:

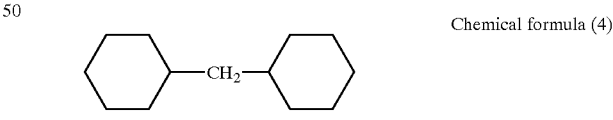

Chemical formula (4)

and wherein the polyimide precursor has an imidization degree of 7.5% or more and 36% or less as determined by equation (a) below:

$(PS_1/PS_2)/(PI_1/PI_2) \times 100$        Equation (a)

wherein $PS_1$ and $PI_1$ represent the absorbances derived from the imide ring and $PS_2$ and PI2 represent the absorbances derived from chemical structure $A^2$ in formula (1) above, and $PS_1$ and $PS_2$ represent the absorbances of the polyimide precursor to be tested for the imidization degree and $PI_1$ and $PI_2$ represent the absorbances of the polyimide precursor after complete imidization.

The present invention also provides the resin composition wherein the photosensitizer is based on an o-quinone diazide compound represented by formula (5) below:

Formula (5)

wherein substituent $R^3$ represents any one of substituents selected from the group consisting of methyl, hydroxyl, methylketone, cyano and the substituents represented by chemical formulae (6)–(8) below, substituent $R^4$ represents any one of substituents selected from the group consisting of hydrogen and the substituents represented by chemical formulae (6)–(8) below, and substituent $R^5$ represents any one of substituents selected from the group consisting of hydrogen and the substituents represented by chemical formulae (6)–(11) below, provided that at least one of substituents $R^3$–$R^5$ represents any one of substituents selected from the group consisting of the substituents represented by chemical formulae (6)–(8) below:

Chemical Formula (6)

Chemical Formula (7)

Chemical Formula (8)

Chemical Formula (9)

Chemical Formula (10)

Chemical Formula (11)

The present invention also provides the resin composition wherein the photosensitizer is based on an o-quinone diazide compound represented by formula (12) below:

Formula (12)

wherein chemical structure $A^3$ represents any one of chemical structures selected from the group consisting of oxygen, sulfonyl, ketone and the chemical structures represented by chemical formulae (13) and (14) below, and substituents $R^6$–$R^{11}$ represent any one of substituents selected from the group consisting of hydrogen, hydroxyl and the substituents represented by chemical formulae (6)–(11) below, provided that at least one of substituents $R^6$–$R^{11}$ represents anyone of substituents selected from the group consisting of the substituents represented by chemical formulae (6)–(8) below:

Chemical Formula (13)

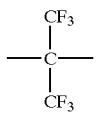

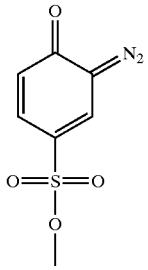

Chemical Formula (6)

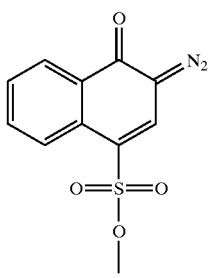

Chemical Formula (7)

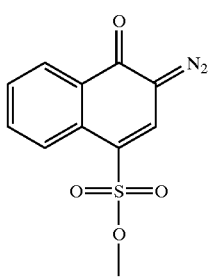

Chemical Formula (8)

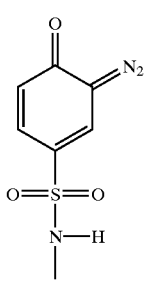

Chemical Formula (9)

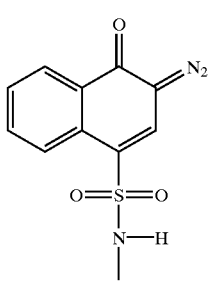

Chemical Formula (10)

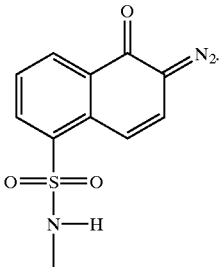

Chemical Formula (14)

Chemical Formula (11)

The present invention also provides the resin composition wherein the o-quinone diazide compound is 2,3,4-trihydroxybenzophenone o-naphthoquinone diazide sulfonic ester represented by chemical formula (15) below:

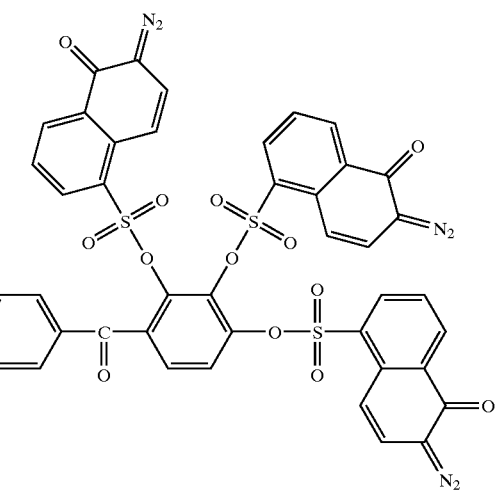

Chemical Formula (15)

The present invention also provides a process for forming a resin film comprising the steps of coating an object on which a resin film is to be formed with a resin composition containing a polyimide precursor having a polymer structure unit represented by formula (1) below and having an imidization degree of 7.5% or more and 36% or less and a photosensitizer to form a resin film, exposing the resin film to light to form a latent image, developing the resin film and heating the resin film to imidize the polyimide precursor,

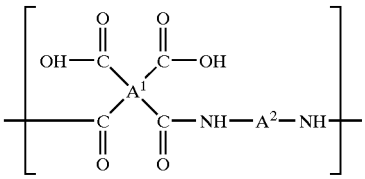

Formula (1)

wherein the chemical structure represented by $A^1$ is biphenyl represented by chemical formula (2) below:

Chemical formula (2)

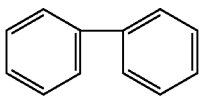

and the chemical structure represented by $A^2$ is an alicyclic compound selected from either one of cyclohexane represented by chemical formula (3) below:

Chemical formula (3)

or 4,4'-methylenebiscyclohexane represented by chemical formula (4) below:

Chemical formula (4)

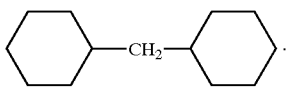

The present invention also provides a process for preparing a resin composition comprising reacting 1,4-diaminocyclohexane represented by chemical formula (16) below:

Chemical formula (16)

with an aromatic dianhydride in a solvent to form a salt, reacting a resin solution containing the salt at a temperature of 80° C. or more and 150° C. or less, then reacting the resin solution at a temperature of 160° C. or more and 250° C. or less to a desired imidization degree and further adding a photosensitizer to the resin solution to give a resin composition.

The present invention also provides a process for preparing a resin composition comprising reacting 4,4'-methylenebis(cyclohexylamine) represented by chemical formula (17) below:

Chemical formula (17)

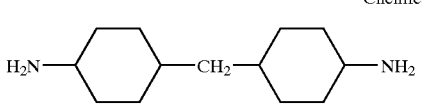

with an aromatic dianhydride in a solvent to form a salt, reacting a resin solution containing the salt at a temperature of 80° C. or more and 150° C. or less, then reacting the resin solution at a temperature of 160° C. or more and 250° C. or less to a desired imidization degree and further adding a photosensitizer to the resin solution to give a resin composition.

In formula (1) above, at least one of the carbons bound to chemical structure $A^1$ is attached to the benzene ring in the aromatic compound. No aromatic compound is included in chemical structure $A^2$ in formula (1) above.

One or both of the two nitrogens bound to the chemical formula represented by $A^2$ may be attached to the alicyclic compound in chemical structure $A^2$ or to a substituent on the alicyclic compound in chemical structure $A^2$. The chemical structure represented by $A^2$ includes not only homocyclic compounds having a cyclic structure consisting of carbons but also heterocyclic compounds.

According to the present invention as defined above, a latent image can be formed by UV irradiation (exposure) even when the resin compositions are used to form a resin film having a film thickness of 10 μm or more because the polyimide precursors used in the present invention include no benzene ring in chemical structure $A^2$ and therefore they have high light transmission over a wide wavelength range including UV rays such as g rays (wavelength 436 nm) and i rays (wavelength 365 nm).

The polyimide precursors in the resin compositions are imidized at 7.5% or more so that they are less soluble in alkalis and therefore unexposed parts are not dissolved in alkaline solutions widely used as developing solutions.

When the polyimide precursors have an imidization degree above 10%, the resin compositions have especially high patternability because of the especially low solubility of the resin compositions for alkalis and the high proportion of remaining unexposed parts.

Although the imidization degree suitable for patterning varies with chemical structure $A^1$ or $A^2$ in formula (1) above, the polyimide precursors having various chemical structures $A^1$, A2 can be patterned so far as the imidization degree is 7.5% or more and 36% or less, more preferably 7.5% or more and less than 20%.

The polyimide precursors can also be imidized by other methods than heating the resin compositions, e.g., the polyimide precursor can be chemically imidized.

Figure 1A:
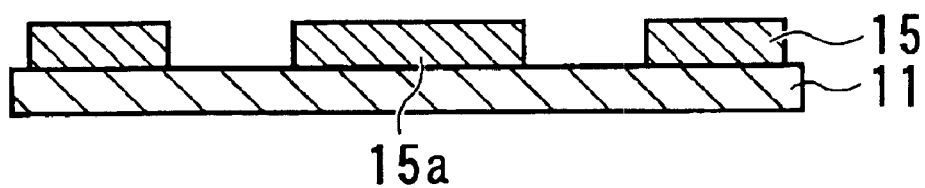
FIG. 1(a) is a diagram for illustrating step (1) for forming a resin film using a resin composition of the present invention.

In the drawings, reference 16 represents a resin film (coating layer), and reference 34 represents a latent image.

THE MOST PREFERRED EMBODIMENTS OF THE INVENTION

First, an example of a preparation process of a resin composition of the present invention is explained.

An alicyclic diamine, 1,4-diaminocyclohexane, and an aromatic dianhydride are reacted in a solvent to prepare a resin solution containing a salt formed of the aromatic dianhydride and 1,4-diaminocyclohexane. Then, this resin solution is heated to a temperature of 80° C. or more and 150° C. or less with stirring and further stirred for a predetermined period at that temperature.

When the salt begins to be partially dissolved, the resin solution is returned to room temperature and stirred for further several hours at room temperature, whereby the aromatic dianhydride and 1,4-diaminocyclohexane in the resin solution are polymerized to form a polyimide precursor having a polymer structure unit shown by formula (1) above in the resin solution. Then, the resin solution is heated to a predetermined temperature (160° C. or more and 250° C. or less) and maintained at that temperature for a predetermined period with stirring, whereby the polyimide precursor in the resin solution is imidized to give a polyimide precursor having an imidization degree of 7.5% or more and 36% or less.

To the resin solution is added an o-quinone diazide compound as a photosensitizer to give a resin composition of the present invention.

Then, the step of forming a resin film using the resin composition of the present invention is explained.

Figure 1B:
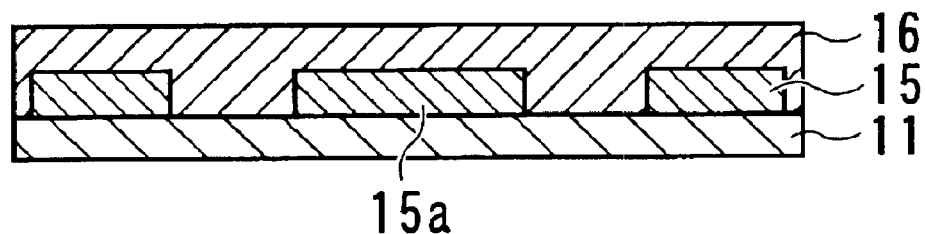
FIG. 1(b) is a diagram for illustrating step (2) for forming a resin film using a resin composition of the present invention.
Figure 1C:
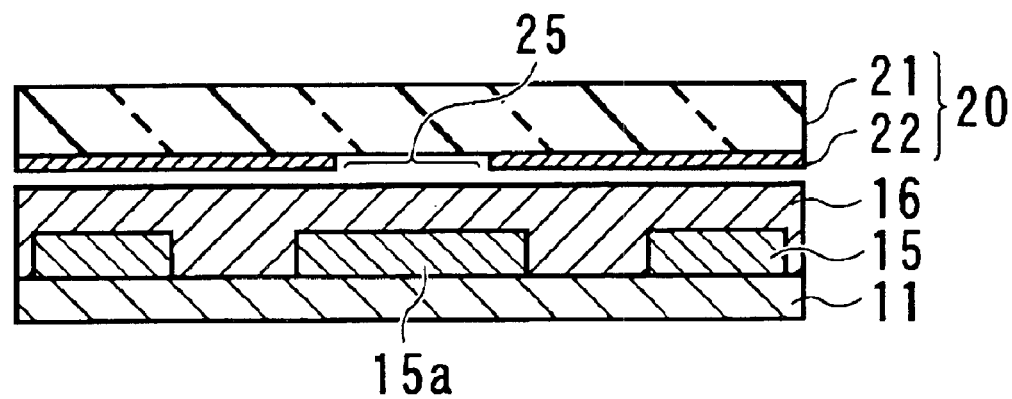
FIG. 1(c) is a diagram for illustrating step (3) for forming a resin film using a resin composition of the present invention.

Reference 11 in FIG. 1(*a*) represents a base film having a metal wiring 15 on one side. Metal wiring 15 consists of a metal foil patterned in a predetermined configuration. Reference 15*a* in the same figure represents a wide part of metal wiring 15 obtained by patterning.

A predetermined amount of the resin composition of the present invention is applied and dried on the surface of base film 11 on the side having metal wiring 15 to form a coating layer (resin film) 16 consisting of the resin composition (FIG. 1(*b*)).

Reference 20 in FIG. 1(*c*) represents a mask film. Mask film 20 has a transparent substrate 21. On the surface of substrate 21 are provided light-shielding parts 22 formed of an opaque thin film and light-transmitting parts 25 located between light-shielding parts 22.

Transmitting parts 25 are located at positions corresponding to wide parts 15*a* of metal wiring 15 and transmitting parts 25 have a diameter smaller than the diameter of wide parts 15*a* of metal wiring 15

The side of mask film 20 having light-shielding parts 22 and transmitting parts 25 is faced to the side of base film 11 having coating layer 16 and mask film 20 and base film 11 are aligned so that transmitting parts 25 and wide parts 15*a* of metal wiring 15 are opposed to each other.

Then, mask film 20 is irradiated with UV rays 30 on the opposite side to coating layer 16 so that UV rays 30 are blocked at light-shielding parts 22 but transmitted at transmitting parts 25 of mask film 20 to irradiate coating layer 16 at the locations of transmitting parts 25 with UV rays 30 (FIG. 2(*a*)).

In coating layer 16, the polyimide precursor interacts with the photosensitizer o-quinone diazide compound, which is thus bound to the carboxylate of the polyimide precursor via a hydrogen bond as shown in reaction formula (1) below.

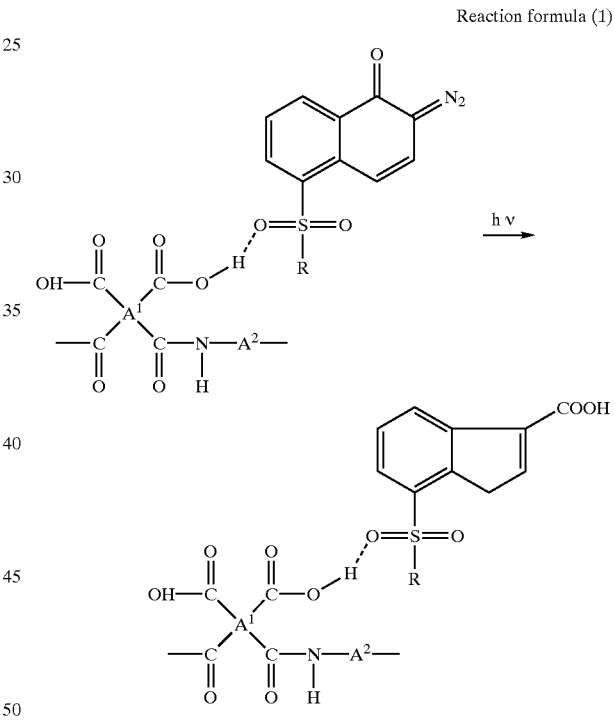

Reaction formula (1)

The chemical structure of the o-quinone diazide compound interacting with the polyimide precursor is changed by photochemical reaction to produce ketene at parts 33 of coating layer 16 irradiated with UV rays 30 (exposed parts) while the chemical structure of the o-quinone diazide compound remains unchanged at parts not irradiated with UV rays (FIG. 2(*b*)). Reference 34 in FIG. 2(*b*) represents a latent image formed of the parts of coating layer 16 not irradiated with UV rays.

Then, the assembly is washed with an alkaline solution as a developing solution so that ketene in exposed parts 33 reacts with water in the developing solution to produce carboxylates, which further react with alkali metal ions or ammonium ions or the like in the developing solution so that exposed parts 33 are dissolved in the developing solution (development).

During then, coating layer 16 at the location of latent image 34 does not react with the developing solution because ketene is not formed there. The polyimide precursor in coating layer 16 is not dissolved in the developing solution because the polyimide precursor has an imidization degree of 7.5% or more and 36% or less. Therefore, latent image 34 is not dissolved in the developing solution and remains.

Figure 2A:
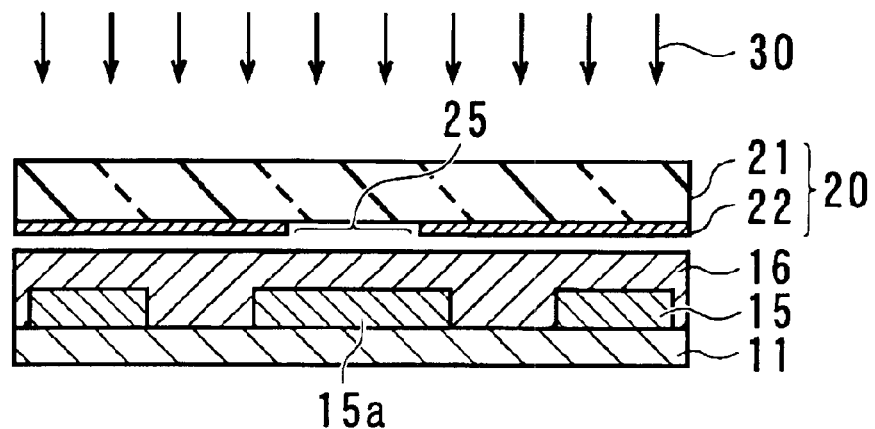
FIG. 2(a) is a diagram for illustrating step (4) for forming a resin film using a resin composition of the present invention.
Figure 2B:
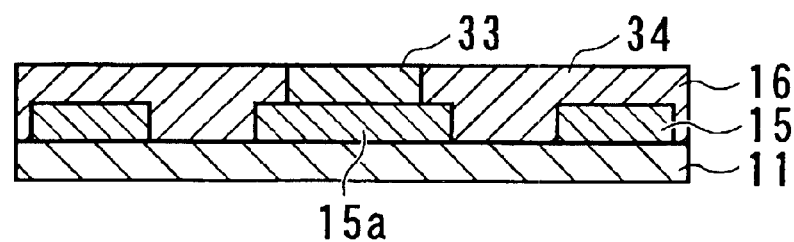
FIG. 2(b) is a diagram for illustrating step (5) for forming a resin film using a resin composition of the present invention.
Figure 2C:
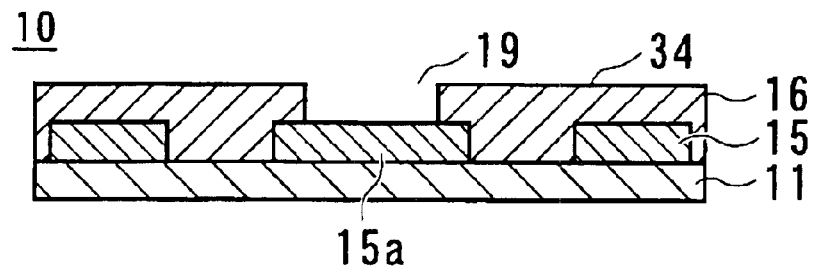
FIG. 2(c) is a diagram for illustrating step (6) for forming a resin film using a resin composition of the present invention.

FIG. 2(c) shows the state after development. Exposed parts 33 have been removed during the developing step whereby an opening 19 is formed in coating layer 16 and only wide parts 15a of metal wiring 15 are exposed at the bottom of opening 19. Then, the assembly is baked to completely imidize the polyimide precursor in coating layer 16 thereby a coating layer 16 consisting of a polyimide is obtained.

Reference 10 in FIG. 2(c) represents a flexible wiring board in which coating layer 16 consisting of a polyimide has been formed, and flexible wiring board 10 can be electrically connected with another electric component by contacting wide part 15a in metal wiring 15 with a terminal of the electric component via opening 19 in coating layer 16.

Resin compositions of the present invention are further explained in detail below.

EXAMPLES

A resin solution was obtained by dissolving 11.4 g (0.1 mol) of an alicyclic diamine, 1,4-diaminocyclohexane, in 867 g of a solvent (N-methylpyrrolidone) in a reaction vessel and then adding 29.4 g of a powder of an aromatic dianhydride 3,3',4,4'-biphenyltetracarboxylic dianhydride in small portions with stirring to form a white complex salt (salt).

Then, the reaction vessel was placed in an oil bath to heat the resin solution to 120° C. and the resin solution was stirred at that temperature for 5 minutes. When the white complex salt was partially dissolved, the reaction vessel was removed from the oil bath and the resin solution was further stirred at room temperature for several hours to give a transparent and viscous resin solution.

In this resin solution has been formed a polyimide precursor having a polymer structure unit represented by formula (1) above wherein chemical structure $A^1$ is biphenyl and chemical structure $A^2$ is cyclohexane. The polymer structure unit of this polyimide precursor is represented by formula (18) below.

Formula (18)

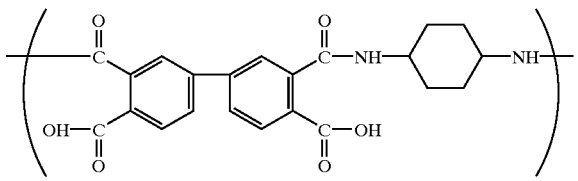

The resin solution was applied on a glass slide to form a coating layer, which was then heated at the heating temperatures shown in Table 1 below for 10 minutes to give 9 specimens.

The coating layers of these specimens were analyzed by FT-IR to measure the absorbance A1780 $cm^{-1}$ derived from the imide ring (the absorbance at wavenumber 1780 $cm^{-1}$ due to the carbonyl symmetric stretching vibration of the imide ring) and the absorbance A2940 $cm^{-1}$ derived from the chemical structure represented by $A^2$ in formula (1) (cyclohexane) (the absorbance at wavenumber 2940 $cm^{-1}$ due to the CH stretching vibration of cyclohexane) and further determine the ratio r of A1780 $cm^{-1}$ to A2940 $cm^{-1}$. These results are shown in Table 1 below.

TABLE 1

Measurement results of absorbance
(determination of a baseline imidization degree)

| Heating temperature (° C.) | Absorbance (A1780 $cm^{-1}$) | Absorbance (A2940 $cm^{-1}$) | r(A1780 $cm^{-1}$/ A2940 $cm^{-1}$) |
|---|---|---|---|
| 100 | 0 | 0 | 0 |
| 120 | 0.00311 | 0.0397 | 0.0784 |
| 140 | 0.00724 | 0.0395 | 0.183 |
| 160 | 0.0131 | 0.0320 | 0.408 |
| 180 | 0.0138 | 0.00949 | 1.46 |
| 200 | 0.0734 | 0.0257 | 2.86 |
| 220 | 0.0665 | 0.0106 | 6.30 |
| 240 | 0.119 | 0.0172 | 6.88 |
| 300 | 0.130 | 0.0145 | 8.94 |

Figure 3:
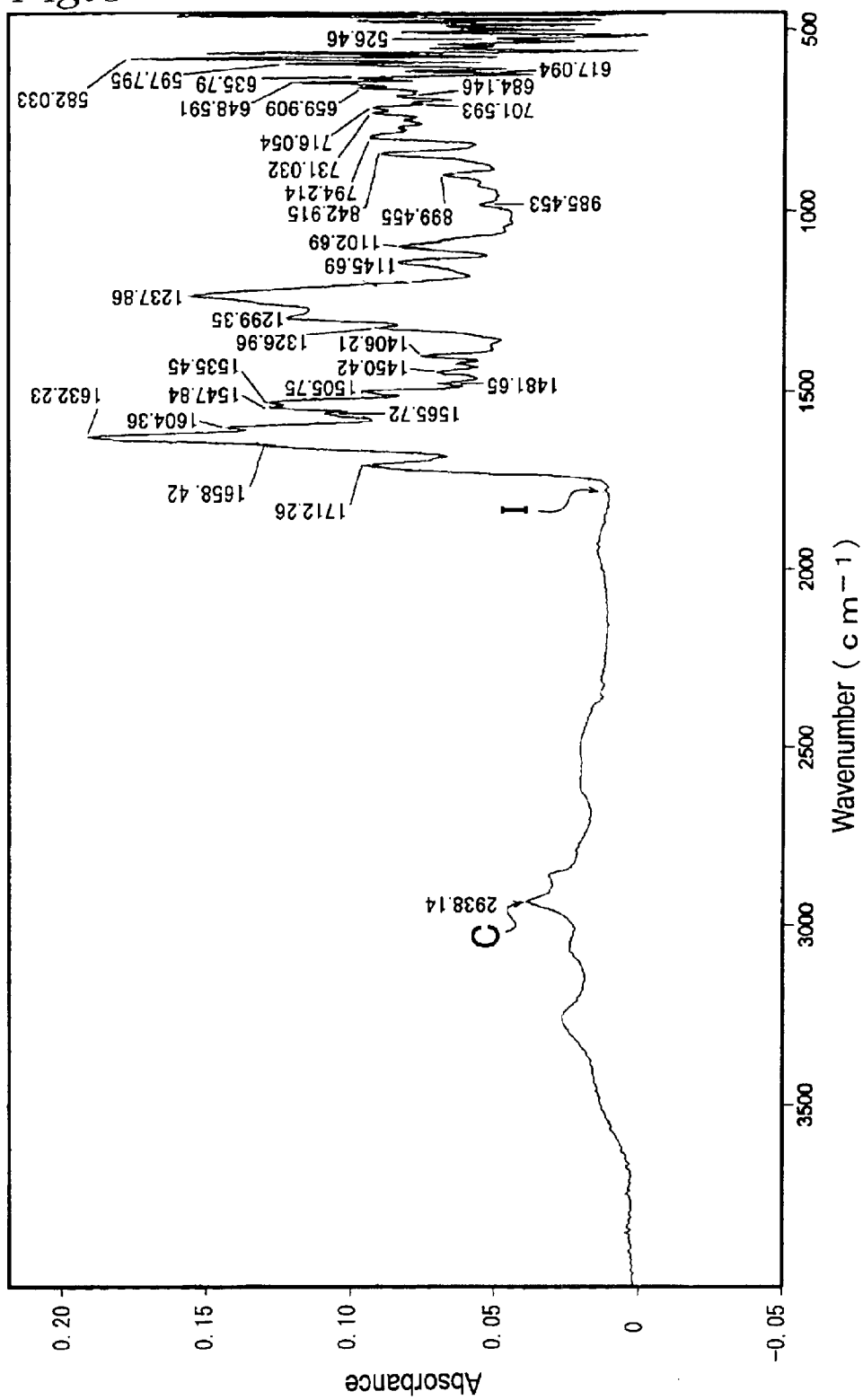
FIG. 3 is a graph showing FT-IR spectrum when a first example of resin solution was heated at 100° C.
Figure 4:
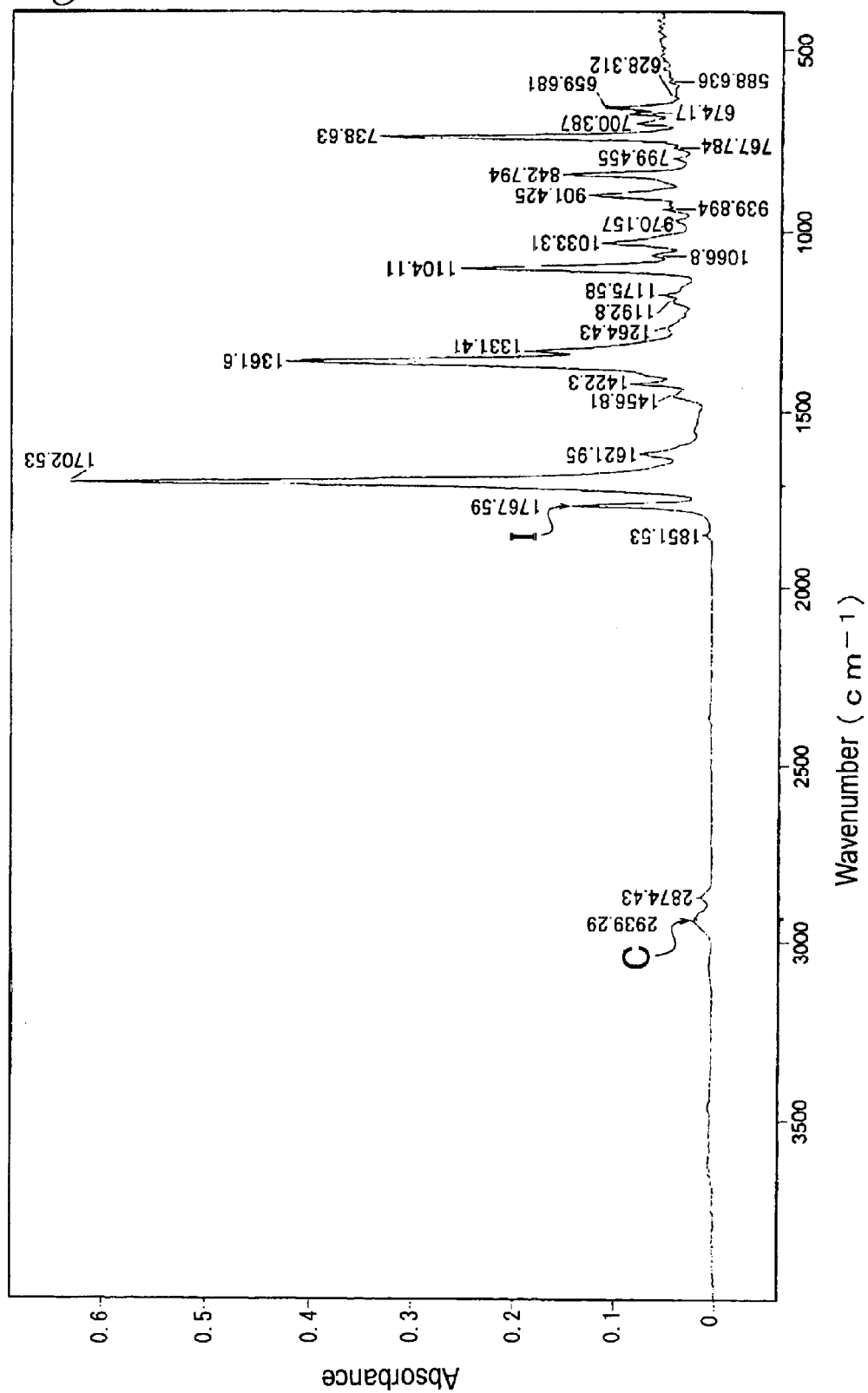
FIG. 4 is a graph showing FT-IR spectrum when the first example of resin solution was heated at 300° C.

FIG. 3 shows the FT-IR absorption spectrum at a heating temperature of 100° C., and FIG. 4 shows the FT-IR absorption spectrum at a heating temperature of 300° C. In FIGS. 3 and 4, reference I represents the absorption peak attributed to the imide ring and reference C represents the absorption peak attributed to cyclohexane, respectively.

Figure 8:
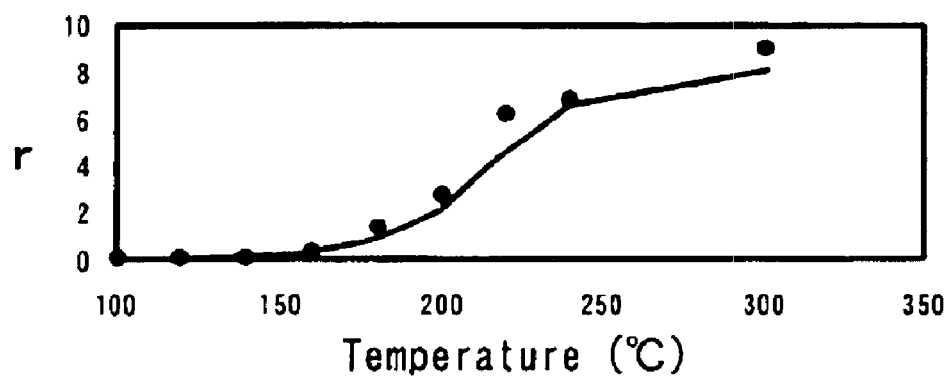
FIG. 8 is a graph showing the relationship between the ratio of A1780 $cm^{-1}$ to A2940 $cm^{-1}$ and the heating temperature.

FIG. 8 is a graph showing the relationship between the ratio r determined for the specimens above and the heating temperature, wherein the ordinate represents the ratio r and the abscissa represents the heating temperature (° C.), respectively.

As shown in FIG. 8, the ratio r increases sharply at heating temperatures of 200° C. or more and less than 250° C. but more slowly at heating temperatures of 250° C. or more and the polyimide precursor seems to have been almost completely imidized at heating temperatures of 300° C. or more.

Thus, this polyimide precursor has an absorbance derived from the imide ring ($PI_1$) A1780 $cm^{-1}$=0.130 and an absorbance derived from chemical structure $A^2$ ($PI_2$) A2940 $cm^{-1}$=0.0145 after complete imidization (at an imidization degree of 100%) and therefore the ratio r of $PI_1$ to $PI_2$ ($PI_1/PI_2$) at an imidization degree of 100% is 8.94.

Separately from these specimens, the resin solution in which a polyimide precursor has been formed was heated to 200° C. and the resin solution was stirred at that temperature for the heating periods shown for Examples 1–5 and Comparative examples 1–3 in Table 2 below to prepare 8 samples.

To 100 parts by weight of each sample was added 20 parts by weight of a diazoquinone compound, 2,3,4-trihydroxybenzophenone o-naphthoquinone diazide sulfonic ester, to prepare resin compositions of Examples 1–5 and Comparative examples 1–3.

TABLE 2

Measurement results of absorbance and imidization degree in function of heating period

|  | Heating period (minutes) | Absorbance (A1780 cm$^{-1}$) | Absorbance (A2940 cm$^{-1}$) | Ratio (r) | Imidization degree (%) |
|---|---|---|---|---|---|
| Comparative example 1 | 0 | 0 | 0 | 0 | 0 |
| Comparative example 2 | 1 | 0.00912 | 0.0455 | 0.200 | 2.24 |
| Comparative example 3 | 2 | 0.0179 | 0.0427 | 0.420 | 4.70 |
| Example 1 | 3 | 0.0278 | 0.0406 | 0.685 | 7.66 |
| Example 2 | 4 | 0.0481 | 0.0367 | 1.31 | 14.7 |
| Example 3 | 5 | 0.0468 | 0.0343 | 1.36 | 15.3 |
| Example 4 | 6 | 0.0594 | 0.0332 | 1.79 | 20.0 |
| Example 5 | 7 | 0.0418 | 0.0198 | 2.11 | 23.6 |

\* In the table above, the ratio r means the ratio of the absorbance shown in the column of A1780 cm$^{-1}$ to the absorbance shown in the column of A2940 cm$^{-1}$ (A1780 cm$^{-1}$/A2940 cm$^{-1}$).

The resin compositions of Examples 1–5 and Comparative examples 1–3 were used to form coating layers 16 having a film thickness of 8 μm through the steps shown in FIGS. 1(a), (b) described above. Then, the resin compositions forming coating layers 16 were analyzed by FT-IR.

Figure 5:
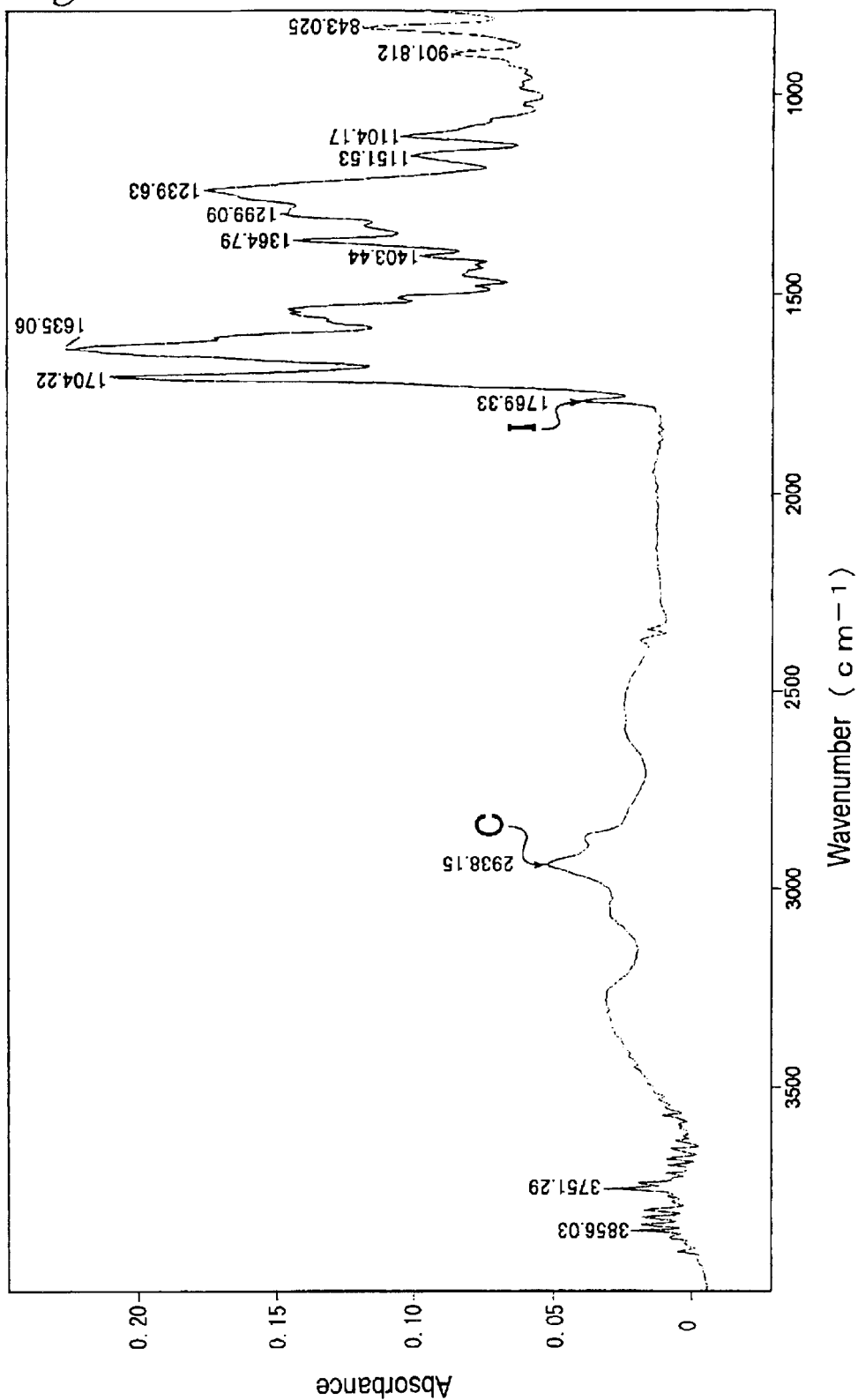
FIG. 5 is a graph showing FT-IR spectrum when the first example of resin solution was heated for 3 minutes.
Figure 6:
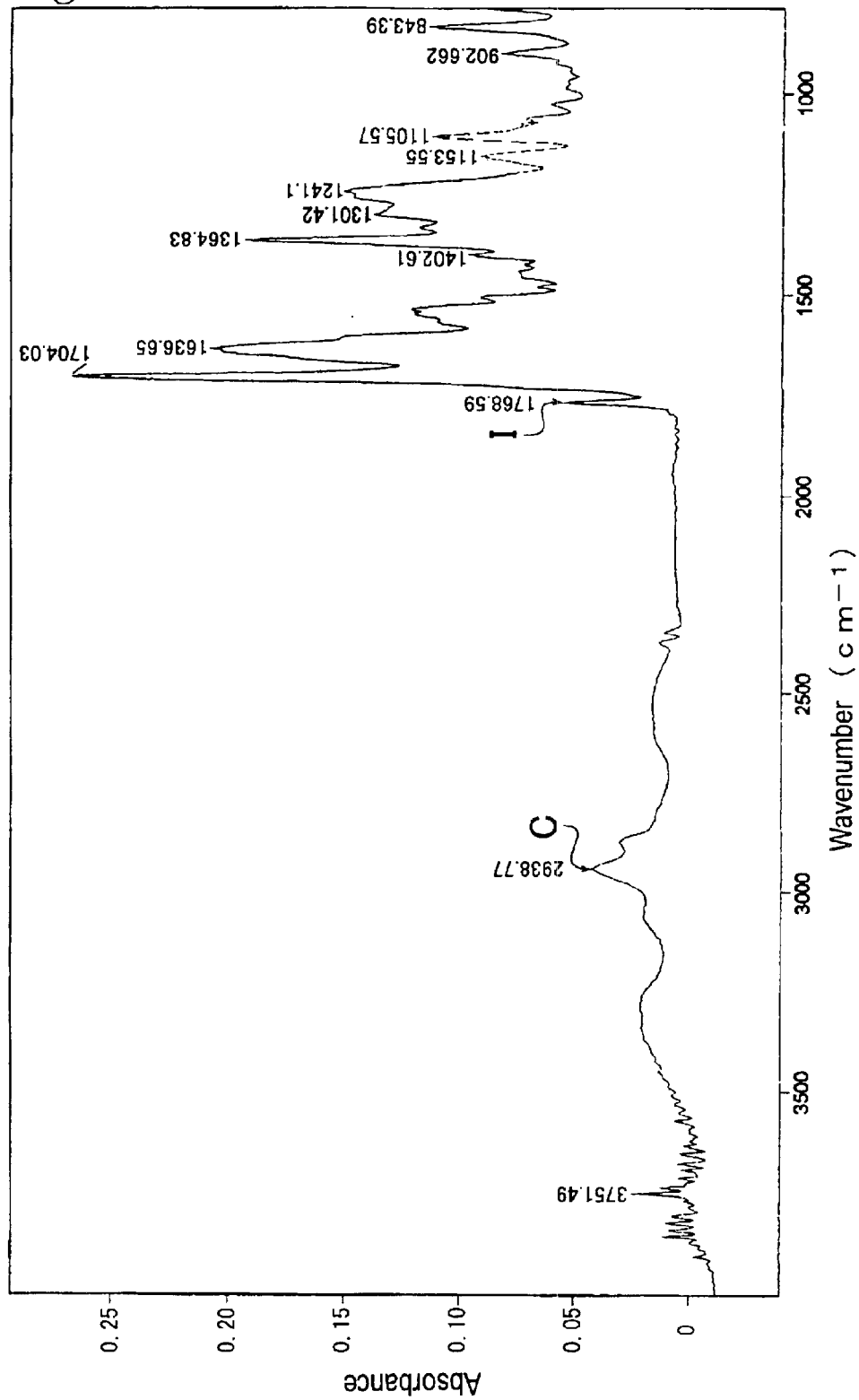
FIG. 6 is a graph showing FT-IR spectrum when the first example of resin solution was heated for 4 minutes.
Figure 7:
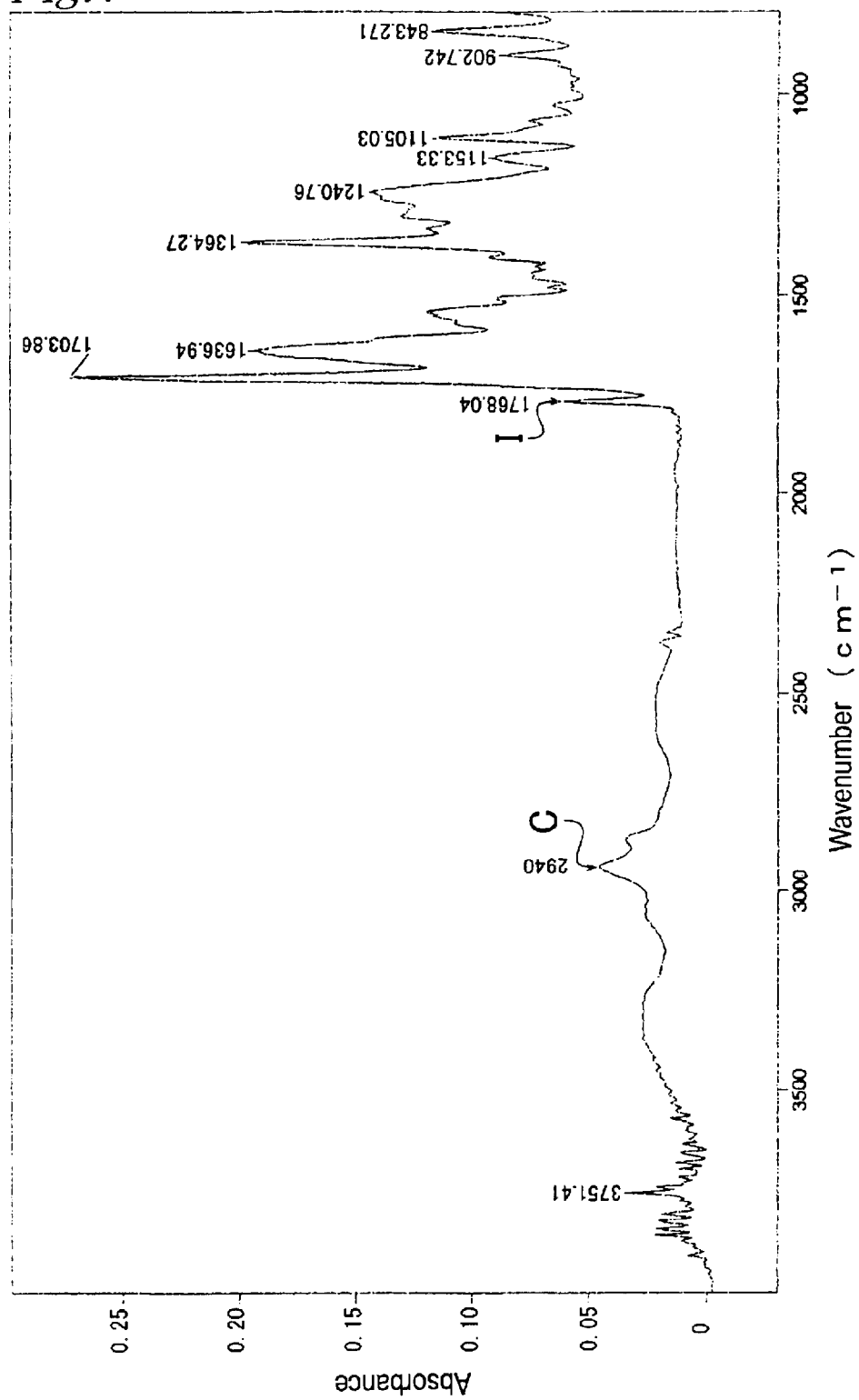
FIG. 7 is a graph showing FT-IR spectrum when the first example of resin solution was heated for 5 minutes.

FIG. 5 shows the FT-IR absorption spectrum of Example 1, FIG. 6 shows the FT-IR absorption spectrum of Example 2, and FIG. 7 shows the FT-IR absorption spectrum of Example 3. In FIGS. 5–7, reference I represents the absorption peak attributed to the imide ring and reference C represents the absorption peak attributed to cyclohexane, respectively.

The ratio r of A1780 cm$^{-1}$ to A2940 cm$^{-1}$ (PS$_1$/PS$_2$) was determined from the absorbance derived from the imide ring (A1780 cm$^{-1}$: PS$_1$) and the absorbance derived from cyclohexane (A2940 cm$^{-1}$: PS$_2$) obtained by FT-IR.

Figure 9:
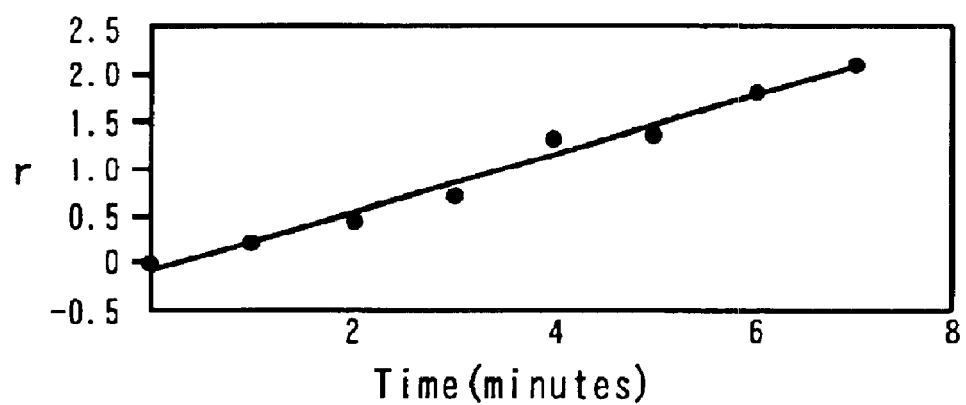
FIG. 9 is a graph showing the relationship between the ratio of A1780 $cm^{-1}$ to A2940 $cm^{31\ 1}$ and the heating period.

The results are shown in Table 2 above and the relationship between the ratio r and the heating period is shown in the graph of FIG. 9, in which the abscissa represents the heating period and the ordinate represents ratio r, respectively. As shown in FIG. 9, the ratio is directly proportional to the heating period within heating periods of 8 minutes.

The ratio r (PS$_1$/PS$_2$) shown in Table 2 and the ratio r (PI$_1$/PI$_2$ =8.94) of the polyimide precursor after complete imidization were substituted into equation (a) above to determine the imidization degree, respectively.

The resulting imidization degrees are shown in Table 2 above. At a heating temperature of 100° C., A1780 cm$^{-1}$ and A2940 cm$^{-1}$ were both shown as 0 in Table 2 because no absorption by the imide ring was observed.

As shown in Table 2, the imidization degree of coating layer 16 was 7.5% or more and less than 20% in Examples 1–3 using heating periods of 3 minutes or more and 5 minutes or less at 200° C. while the imidization degree exceeded 20% in Examples 4 and 5 using heating periods of 6 minutes or more. However, the imidization degree was less than 5% in Comparative examples 1–3 using heating periods of 2 minutes or less.

Then, coating layers 16 using the resin compositions of Examples 1–3 and Comparative examples 1–3 were measured for transmittance in a wavelength range from 300 nm to 700 nm.

Figure 10:
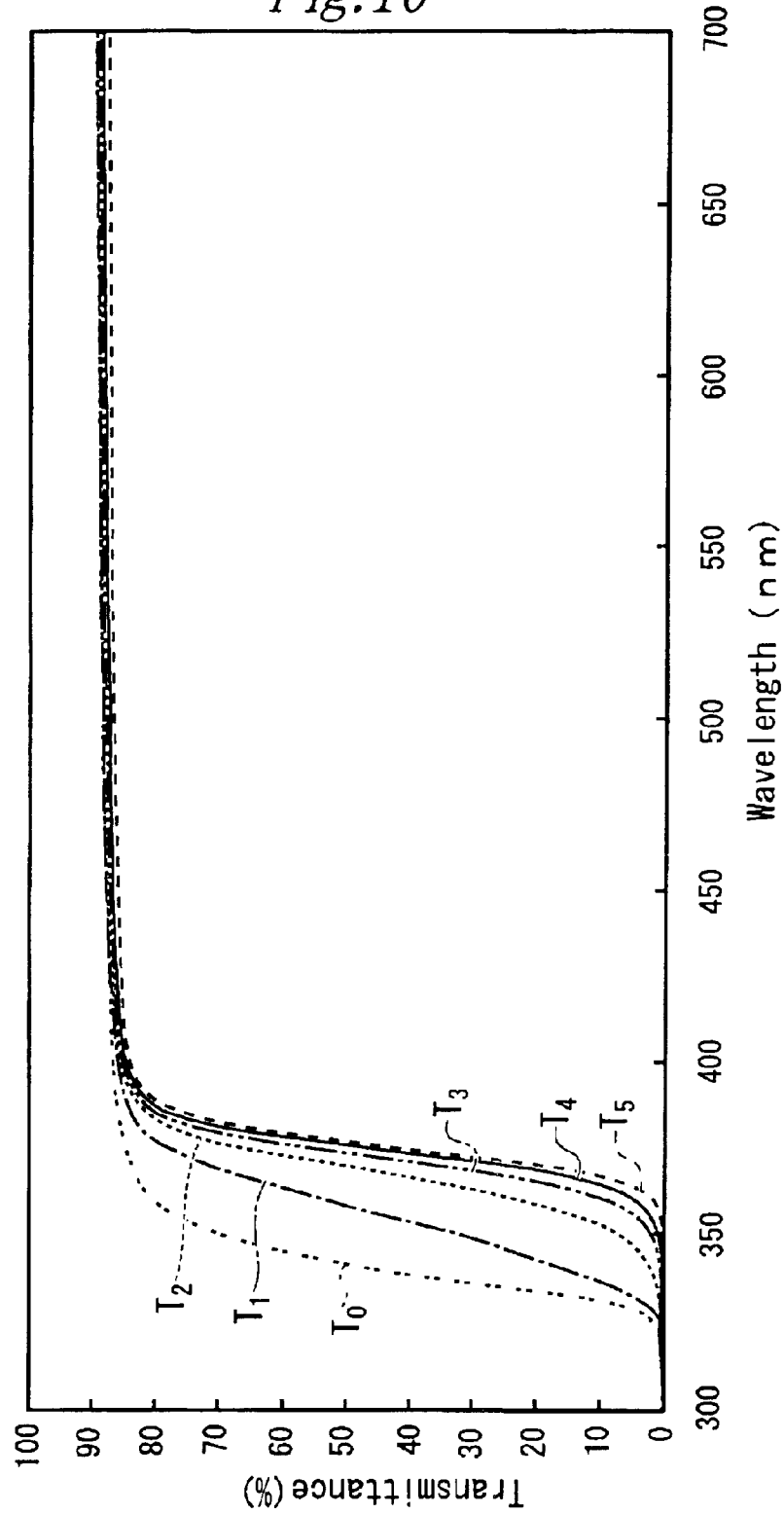
FIG. 10 is a graph showing the relationship between the transmittance and the wavelength of coating layers consisting of resin compositions using the first example of resin solution.

FIG. 10 is a graph showing the measurement results of the transmittance, in which the ordinate represents the transmittance (%) and the abscissa represents the wavelength (nm), respectively. In FIG. 10, references T$_0$–T$_2$ show graphs of the compositions obtained by heating the resin solution for 0–2 minutes (Comparative examples 1–3) and references T$_3$–T$_5$ show graphs of those obtained by heating the resin solution for 3–5 minutes (Examples 1–3).

As shown in FIG. 10, the transmittance is lower at shorter wavelengths in Examples 1–3 obtained by heating the resin solution for 3 minutes or more and 5 minutes or less (imidization degree of 7.5% or more and less than 20%) as compared with Comparative examples 1–3, but Examples 1–3 show sufficient transmittances at wavelengths of 360 nm or more. These results demonstrated that the resin compositions of Examples 1–3 have sufficient transmission for UV rays at wavelengths commonly used for exposure (wavelength 436 nm, wavelength 365 nm).

Then, the coating layer 16 prepared through the steps described above was patterned through the steps shown in FIG. 1(c) and FIGS. 2(a)–(c) described above, and then imidized to give 9 flexible wiring boards 10. These flexible wiring boards 10 were used to test the "patternability" and "remaining film thickness" shown below.

[Patternability]

The surfaces of coating layers 16 of flexible wiring boards 10 were visually observed and coating layers 16 in which opening 19 has been formed were assessed as "good" while those in which opening 19 has not been formed were assessed as "poor".

[Remaining Film Thickness]

Flexible wiring boards 10 ranked as "good" in the patternability test above were measured for the film thickness (μm) at any part where opening 19 is not located.

The measurement results are shown in Table 3 below along with the imidization degrees shown in Table 2 above.

TABLE 3

Imidization degree and evaluation test results($A^2$ = cyclohexane)

|  | Heating period (minutes) | Imidization degree(%) | Patternability | Remaining film thickness ($\mu$m) |
|---|---|---|---|---|
| Comparative example 1 | 0 | 0 | Poor | — |
| Comparative example 2 | 1 | 2.24 | Poor | — |
| Comparative example 3 | 2 | 4.70 | Poor | — |
| Example 1 | 3 | 7.66 | Good | 1 |
| Example 2 | 4 | 14.7 | Good | 6~7 |
| Example 3 | 5 | 15.3 | Good | 6~7 |
| Example 4 | 6 | 20.0 | Gelled | — |
| Example 5 | 7 | 23.6 | Precipitated | — |

As shown in Table 3 above, excellent patternability was obtained in Examples 1–3 where the imidization degree of the polyimide precursor was in the range of 7.5% or more and less than 20%. Especially in Examples 2 and 3 where the imidization degree was above 10% and below20%, the remaining film thickness (film thickness after patterning) was 6 $\mu$m or more while the initial film thickness (film thickness before patterning) was 8 $\mu$m, demonstrating that the solubility of coating layer 16 for the developing solution was sufficiently lowered by imidization.

In Comparative examples 1–3 where the imidization degree of the polyimide precursor was less than 7%, however, the coating layer was highly soluble in the developing solution and other parts than latent image 33 were also dissolved, whereby the coating layer was wholly removed. In examples 4 and 5 where the imidization degree was 20% or more, coating layer 16 was not dissolved in the developing solution but the polyimide precursor was gelled or precipitated in the resin composition and the coating layer itself was poorly formed.

EXAMPLES

A resin solution was prepared under the same conditions as in Example 1 using 4,4'-methylenebis(cyclohexylamine) as an alicyclic amine in place of 1,4-diaminocyclohexane used in Example 1 and the same aromatic dianhydride and solvent as used in Example 1.

In this resin solution has been formed a polyimide precursor having a polymer structure unit represented by formula (1) above wherein chemical structure $A^1$ is biphenyl and chemical structure $A^2$ is 4,4'-methylenebiscyclohexane. The polymer structure unit of this polyimide precursor is represented by formula (19) below.

This resin solution was used to prepare 5 specimens under the same conditions as described for the previous specimens except that the heating temperature was changed as shown in Table 4 below.

Then, the coating layers of these specimens were analyzed by FT-IR to measure the absorbance (A1770 $cm^{-1}$) derived from the imide ring and the absorbance (A2927 $cm^{-1}$) derived from the chemical structure represented by $A^2$ in formula (1) (4,4'-methylenebiscyclohexane) and further determine the ratio r of A1770 $cm^{-1}$ to A2927 $cm^{-1}$. These results are shown in Table 4 below.

TABLE 4

Measurement results of absorbance (determination of a baseline imidization degree)

| Heating temperature (° C.) | Absorbance (A1770 $cm^{-1}$) | Absorbance (A2927 $cm^{-1}$) | r(A1780 $cm^{-1}$/ A2940 $cm^{-1}$) |
|---|---|---|---|
| 100 | 0 | 0.0532 | 0 |
| 150 | 0.0170 | 0.0539 | 0.316 |
| 200 | 0.0767 | 0.0428 | 1.79 |
| 250 | 0.112 | 0.0471 | 2.38 |
| 300 | 0.101 | 0.0385 | 2.63 |

Figure 11:
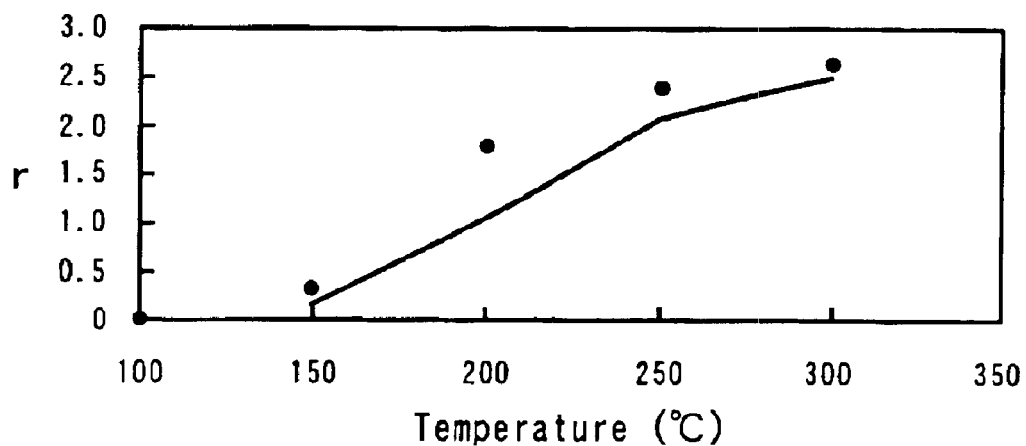
FIG. 11 is a graph showing the relationship between the ratio of A1770 cm$^{-1}$ to A2927 cm$^{-1}$ and the heating temperature.

FIG. 11 is a graph showing the relationship between the ratio r determined for the specimens above and the heating temperature (° C.), wherein the ordinate represents the ratio r and the abscissa represents the heating temperature (° C.), respectively.

As shown in FIG. 11, the ratio r slightly increases at heating temperatures of 250° C. or more and the polyimide precursor seems to have been almost completely imidized at heating temperatures of 300° C. or more.

Thus, this polyimide precursor has an absorbance derived from the imide ring ($PI_1$,) A1770 $cm^{-1}$=0.101 and an absorbance derived from chemical structure $A^2$ ($PI_2$) A2927 $cm^{-1}$=0.0385 at an imidization degree of 100% and therefore the ratio r of $PI_1$ to $PI_2$ ($PI_1/PI_2$) at an Imidization degree of 100% is 2.63.

Separately from these specimens, the resin solution in which a polyimide precursor has been formed was heated for the periods shown in the column of heating period in Table 5 below under the same conditions as in Example 1 to give 10 samples, to which was then added the same diazoquinone compound as used in Example 1 at the same proportion as in Example 1 to prepare resin compositions of Examples 6–11 and Comparative examples 4–7.

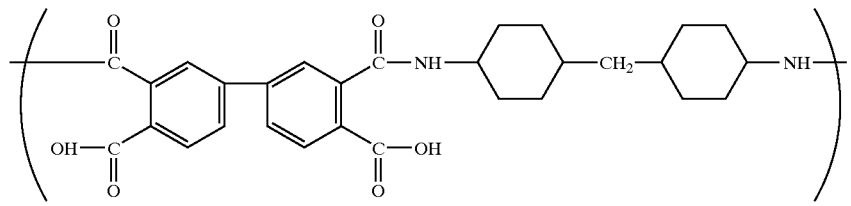

Formula (19)

TABLE 5

Measurement results of absorbance and imidization degree in function of heating period

|  | Heating period (minutes) | Absorbance (A1770 cm$^{-1}$) | Absorbance (A2927 cm$^{-1}$) | Ratio (r) | Imidization degree (%) |
|---|---|---|---|---|---|
| Comparative example 4 | 0 | 0 | 0.0532 | 0 | 0 |
| Comparative example 5 | 1 | 0.00729 | 0.0524 | 0.139 | 5.28 |
| Comparative example 6 | 2 | 0.0100 | 0.0539 | 0.186 | 7.08 |
| Example 6 | 3 | 0.0124 | 0.0530 | 0.234 | 8.87 |
| Example 7 | 4 | 0.0217 | 0.0512 | 0.423 | 16.1 |
| Example 8 | 5 | 0.0320 | 0.0513 | 0.624 | 23.7 |
| Example 9 | 6 | 0.0381 | 0.0568 | 0.670 | 25.5 |
| Example 10 | 7 | 0.0411 | 0.0534 | 0.769 | 29.2 |
| Example 11 | 8 | 0.0479 | 0.0513 | 0.935 | 35.5 |
| Comparative example 7 | 10 | 0.0582 | 0.0511 | 1.14 | 43.3 |

* In the table above, the ratio r means the ratio of the absorbance shown in the column of A1770 cm$^{-1}$ to the absorbance shown in the column of A2927 cm$^{-1}$ (A1770 cm$^{-1}$/A2927 cm$^{-1}$)

The resin compositions of Examples 6–11 and Comparative examples 4–7 were used to form coating layers 16 under the same conditions as in Example 1 and these coating layers were analyzed by FT-IR.

The ratio r of A1770 cm$^{-1}$ to A2927 cm$^{-1}$ (PS$_1$/PS$_2$) was determined from the absorbances A1770 cm$^{-1}$ (PS$_1$) and A2927 cm$^{-1}$ (PS$_2$) obtained by FT-IR, and the results are shown in Table 5 above.

Further, the ratio r (PS$_1$/PS$_2$) shown in Table 5 and the ratio r (PI$_1$/PI$_2$=2.63) of the polyimide precursor after complete imidization were substituted into equation (a) above to determine the imidization degree. The imidization degrees are shown in Table 5 above.

Figure 12:
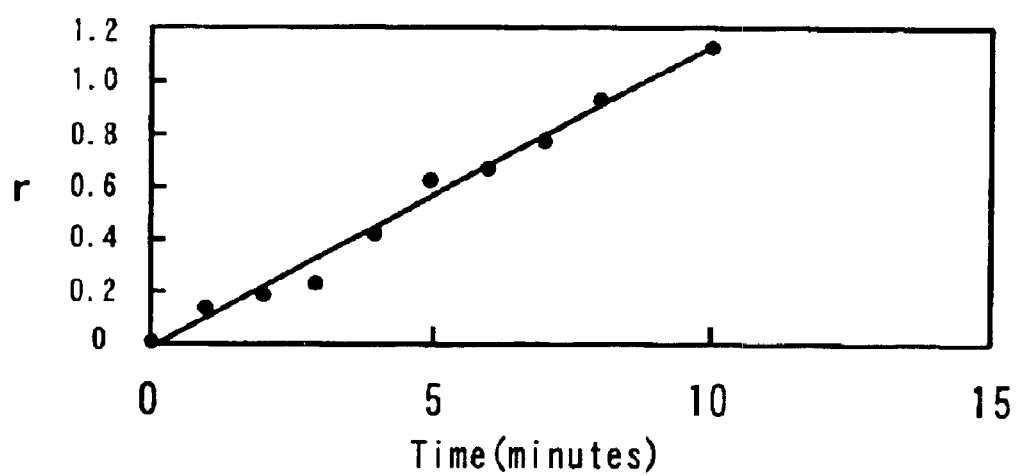
FIG. 12 is a graph showing the relationship between the ratio of A1770 cm$^{-1}$ to A2927 cm$^{-1}$ and the heating period.

The graph of FIG. 12 shows the relationship between the ratio r and the heating period, in which the abscissa represents the heating period (minutes) and the ordinate represents the ratio r, respectively. As shown in FIG. 12, the ratio r is directly proportional to the heating period within heating periods of 10 minutes or less.

Figure 13:
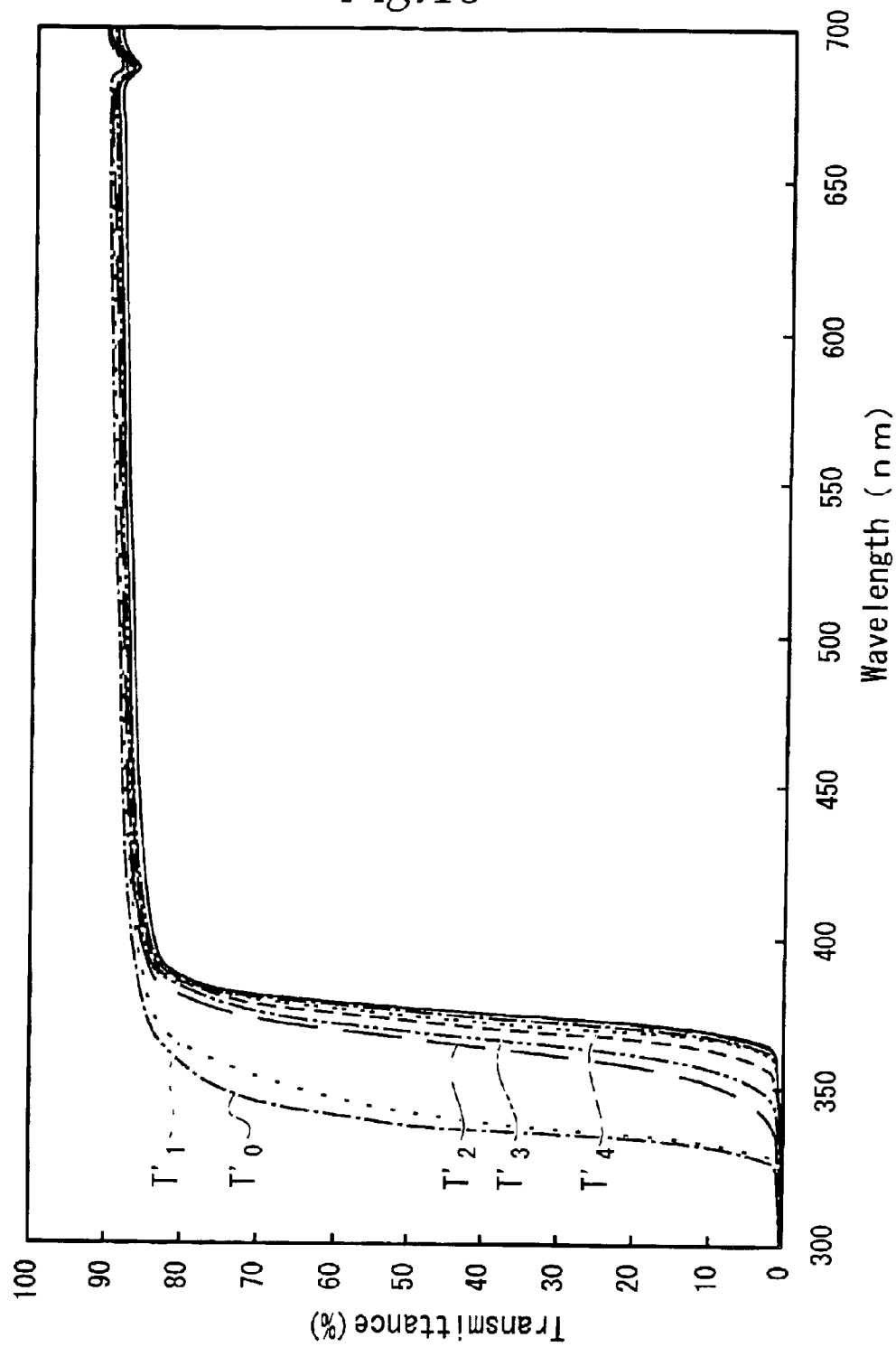
FIG. 13 is a graph showing the relationship between the transmittance and the wavelength of coating layers consisting of resin compositions using the second example of resin solution.

Then, coating layers 16 consisting of the resin compositions of Examples 6–11 and Comparative examples 4–7 were measured for transmittance under the same conditions as in Example 1 above. FIG. 13 is a graph showing the measurement results, in which the ordinate represents the transmittance (%) and the abscissa represents the wavelength (nm), respectively. References T$_0$–T$_4$ show graphs using heating periods of 0–4 minutes (Examples 6, 7, Comparative examples 4–6). The curves rising from wavelengths of 360 nm or more show graphs for heating periods of 5, 6, 7 and 8 minutes.

As shown in FIG. 13, it was demonstrated that the resin compositions have sufficient transmission for UV rays at wavelengths commonly used for exposure (wavelength 436 nm, wavelength 365 nm) when the heating period is 8 minutes or less (at an imidization degree of less than 36%).

Then, the coating layer 16 prepared through the steps described above was patterned under the same conditions as in Example 1, and then imidized to give 10 flexible wiring boards 10. These flexible wiring boards 10 were used to test the "patternability" and "remaining film thickness" under the same conditions as in Example 1. The film thickness of each coating layer 16 before patterning was measured and shown in the column of "initial thickness" in Table 6 below for the samples ranked as "good" in the "patternability" test. These measurement results are shown in Table 6 below along with the imidization degrees.

TABLE 6

Imidization degree and evaluation test results
($A^2$ = 4,4'-methylenebiscyclohexane)

|  | Heating period (minutes) | Imidization degree (%) | Patternability | Initial film thickness (μm) | Remaining film thickness (μm) |
|---|---|---|---|---|---|
| Comparative example 4 | 0 | 0 | Poor | — | — |
| Comparative example 5 | 1 | 5.28 | Poor | — | — |
| Comparative example 6 | 2 | 7.08 | Poor | — | — |
| Example 6 | 3 | 8.87 | Good | 11 | 3 |
| Example 7 | 4 | 16.07 | Good | 11 | 9 |

TABLE 6-continued

Imidization degree and evaluation test results
($A^2$ = 4,4'-methylenebiscyclohexane)

| | Heating period (minutes) | Imidization degree (%) | Patternability | Initial film thickness (μm) | Remaining film thickness (μm) |
|---|---|---|---|---|---|
| Example 8 | 5 | 23.71 | Good | 9 | 9 |
| Example 9 | 6 | 25.47 | Good | 8 | 8 |
| Example 10 | 7 | 29.21 | Good | 8 | 8 |
| Example 11 | 8 | 35.52 | Good | 10 | 10 |
| Comparative example 7 | 10 | 43.27 | Gelled | — | — |

As shown in Table 6 above, the patternability was good when the imidization degree was 7.5% or more and less than 36%. Especially when the imidization degree was 16% or more, the remaining film thickness was large, demonstrating that the solubility of coating layer 16 for the developing solution was sufficiently low.

In Comparative example 7 where the imidization degree exceeded 36%, the polyimide was gelled in the resin composition and the coating layer was very hard to form.

Then, a polyimide precursor for use in resin compositions of Comparative examples 8–13 described below was prepared, which has the same chemical structure as that of the polyimide precursor used in Example 1 except that chemical structure $A^2$ in formula (1) above is an aromatic compound (benzene ring). The chemical structure of this polyimide precursor is represented by formula (20) below.

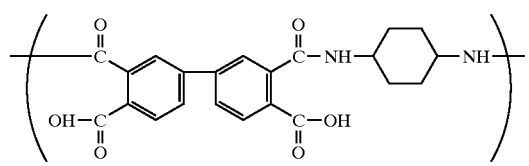

式 (20)

A resin solution based on this polyimide precursor was used to prepare 7 specimens under the same conditions as described for the previous specimens except that the heating temperature was changed as shown in Table 7 below.

TABLE 7

Measurement results of absorbance
(determination of a base line imidization degree)

| Heating temperature (° C.) | Absorbance (A1774 $cm^{-1}$) | Absorbance (A1515 $cm^{-1}$) | r(A1774 $cm^{-1}$/ A1515 $cm^{-1}$) |
|---|---|---|---|
| 100 | 0 | 0 | 0 |
| 120 | 0.0126 | 0.179 | 0.0707 |
| 160 | 0.0429 | 0.310 | 0.138 |
| 200 | 0.116 | 0.296 | 0.391 |
| 220 | 0.137 | 0.275 | 0.497 |

TABLE 7-continued

Measurement results of absorbance
(determination of a base line imidization degree)

| Heating temperature (° C.) | Absorbance (A1774 $cm^{-1}$) | Absorbance (A1515 $cm^{-1}$) | r(A1774 $cm^{-1}$/ A1515 $cm^{-1}$) |
|---|---|---|---|
| 240 | 0.149 | 0.265 | 0.564 |
| 300 | 0.152 | 0.265 | 0.574 |

These specimens were analyzed by FT-IR to measure the absorbance (A1774 $cm^{-1}$) derived from the imide ring and the absorbance (A1515 $cm^{-1}$) derived from chemical structure $A^2$ in formula (1) (benzene ring) and further determine the ratio r of A1774 $cm^{-1}$ to A1515 $cm^{-1}$. These results are shown in Table 7 above.

Figure 14:
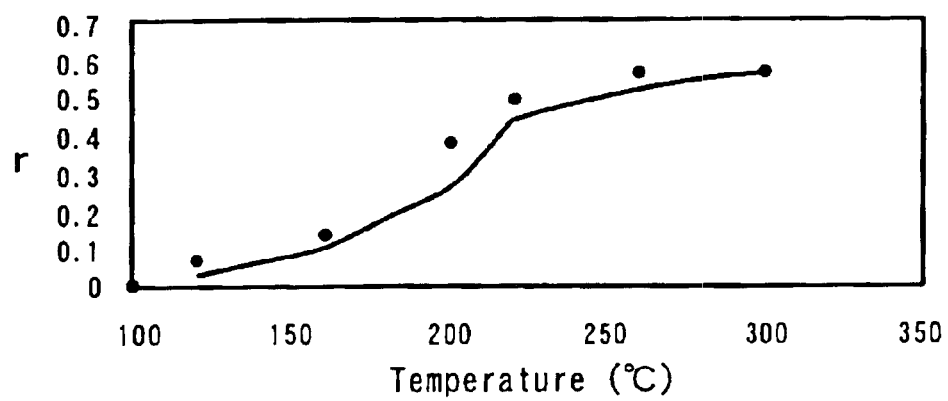
FIG. 14 is a graph showing the relationship between the ratio of A1774 cm$^{-1}$ to A1515 cm$^{-1}$ and the heating temperature.

FIG. 14 is a graph showing the relationship between the ratio r determined for the specimens above and the heating temperature, wherein the ordinate represents the ratio r and the abscissa represents the heating temperature (° C.), respectively.

As shown in FIG. 14, the polyimide precursor has been almost completely imidized at a heating temperature of 300° C.

Thus, the ratio r of A1774 $cm^{-1}$ to A1515 $cm^{-1}$ ($PI_1/PI_2$) is 0.574 when this polyimide precursor is completely imidized.

Then, a resin solution based on the polyimide precursor above was used to prepare resin compositions of Comparative examples 8–13 under the same conditions as in Example 1.

The resin compositions of Comparative examples 8–13 were used to form coating layers under the same conditions as in Example 1 and these coating layers were analyzed by FT-IR to measure the absorbances A1774 $cm^{-1}$ ($PS_1$) and A1515 $cm^{-1}$ ($PS_2$) and further determine the ratio r of A1774 $cm^{-1}$ to A1515 $cm^{-1}$ ($PS_1/PS_2$).

These ratio r ($PS_1/PS_2$) and r ($PI_1/PI_2$=0.574) of the polyimide precursor after complete imidization were substituted into equation (a) above to determine the imidization degree. The imidization degree is shown in Table 8 below along with the absorbance at each wavelength.

TABLE 8

Measurement results of absorbance and imidization degree in function of heating period

| | Heating period (minutes) | Absorbance (A1774 cm$^{-1}$) | Absorbance (A1515 cm$^{-1}$) | Ratio (r) | Imidization degree (%) |
|---|---|---|---|---|---|
| Comparative example 8 | 0 | 0 | 0 | 0 | 0 |
| Comparative example 9 | 1 | 0.0137 | 0.289 | 0.0474 | 8.26 |
| Comparative example 10 | 2 | 0.0289 | 0.295 | 0.0977 | 17.0 |
| Comparative example 11 | 3 | 0.0414 | 0.292 | 0.142 | 24.7 |
| Comparative example 12 | 4 | 0.0484 | 0.295 | 0.164 | 28.6 |
| Comparative example 13 | 5 | 0.0607 | 0.295 | 0.206 | 35.9 |

* In the table above, the ratio r means the ratio of the absorbance shown in the column of A1774 cm$^{-1}$ to the absorbance shown in the column of 1515 cm$^{-1}$ (A1774 cm$^{-1}$/A1515 cm$^{-1}$).

Figure 15:
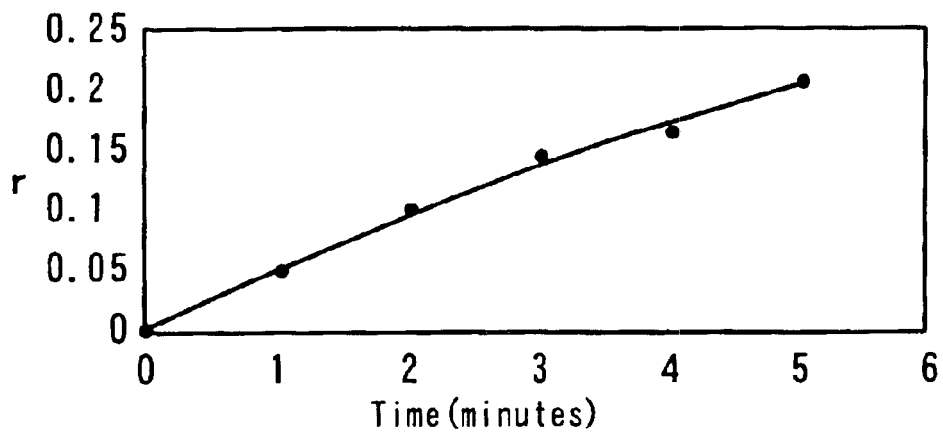
FIG. 15 is a graph showing the relationship between the ratio of A1774 cm$^{-1}$ to A1515 cm$^{-1}$ and the heating period.

The graph of FIG. 15 shows the relationship between the ratio r ($PS_1/PS_2$) and the heating period (minutes), in which the ordinate represents the ratio r and the abscissa represents the heating period, respectively. As shown in FIG. 15, the ratio r is directly proportional to the heating period within heating periods of 5 minutes or less.

As shown in Table 8 above, the imidization degree of the polyimide in the coating layer using the resin compositions of Comparative examples 8–13 was 8% or more and less than 36%.

Figure 16:
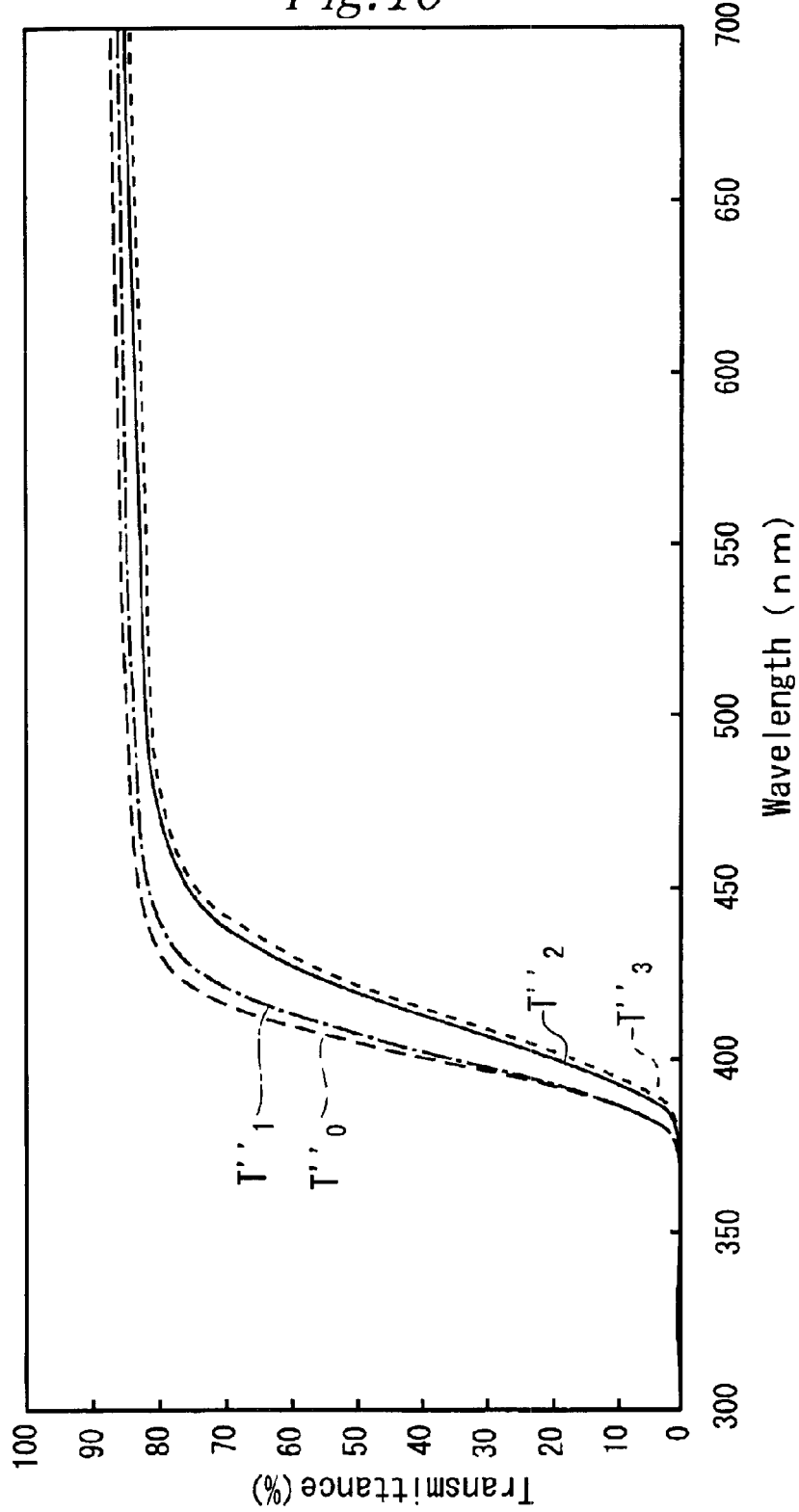
FIG. 16 is a graph showing the relationship between the transmittance and the wavelength of coating layers consisting of resin compositions of the comparative examples.

The coating layers using the resin compositions of Comparative examples 8–11 were measured for transmittance under the same conditions as in Example 1 above. FIG. 16 is a graph showing the measurement results of the transmittance, in which the ordinate represents the transmittance (%) and the abscissa represents the wavelength (nm), respectively. References T"$_0$–T"$_3$ in FIG. 16 show graphs using heating periods of 0–3 minutes (Comparative examples 8–11), respectively.

As shown in FIG. 16, the polyimide precursor of formula (1) wherein chemical structure $A^2$ is benzene is hardly permeable to UV rays at wavelength of 378 nm or less even without heat treatment as in Comparative example 6, demonstrating that it has a much lower 5 transmittance as compared with the polyimide precursors used in Examples 1–11 at shorter wavelengths.

Then, the resin compositions of Comparative examples 8–13 were used to prepare 6 flexible wiring boards under the same conditions as in Example 1. These flexible wiring boards were used to test the "patternability" and "remaining film thickness" under the same conditions as in Example 1. The test results are shown in Table 9 below along with the heating period and the imidization degree.

TABLE 9

Imidization degree and evaluation test results ($A^2$ = benzene)

| | Heating period (minutes) | Imidization degree (%) | Patternability | Remaining film thickness (μm) |
|---|---|---|---|---|
| Comparative example 8 | 0 | 0 | Poor | — |
| Comparative example 9 | 1 | 8.26 | Poor | — |
| Comparative example 10 | 2 | 17.02 | Poor | — |
| Comparative example 11 | 3 | 24.68 | Good | 1 |
| Comparative example 12 | 4 | 28.62 | Gelled | — |
| Comparative example 13 | 5 | 35.87 | Precipitated | — |

As shown in Table 9 above, the patternability of Comparative examples 8–10 using imidization degrees of 20% or less was poor, demonstrating that the patternability was lower at any imidization degree as compared with Examples 1–11. This is probably because the transmittance of the polyimide precursor used in Comparative examples 6–11 was lower than those of the polyimide precursors used in Examples 1–11 so that UV rays were not transmitted through the coating layers and therefore the photosensitizer did not sufficiently react.

When the resin composition of Comparative example 11 having an imidization degree of 24.68% was used, the coating layer was patterned but the remaining film thickness was only 1 μm while the initial film thickness was 8 μm for the same reason as described above for Comparative examples 8–10.

In comparative examples 12 and 13 having an imidization degree of 28% or more, the polyimide precursor was gelled or precipitated in the resin composition so that any coating layer could not be formed.

Although chemical structure $A^2$ in the polymer unit of the polyimide precursor is cyclohexane in the foregoing examples, the present invention is not limited thereto. $A^2$ in formula (1) can be any one of various alicyclic compounds. The alicyclic compounds here include derivatives of e.g., cyclic ketones and cyclic alcohols.

The chemical structure represented by $A^1$ in formula (1) is not limited to biphenyl, either, but polymer units wherein chemical structure $A^1$ is one of various aromatic compounds such as phenyl compounds or naphthalene and naphthalene derivatives are also included in the present invention.

Although 2,3,4-trihydroxybenzophenone o-naphthoquinone diazide sulfonic ester is used as a photosensitizer in the foregoing examples, the present invention is not limited thereto but various agents represented by formula (5) or formula (12) above can be used.

Although the step of heating the resin solution to dissolve the salt and the step of heating the resin solution to imidize the polyimide precursor are separately performed in the foregoing examples, the present invention is not limited thereto. For example, the step of heating the resin solution in which a salt has been formed at 160° C. or more and 250° C. or less to dissolve the salt and the imidization step may be performed in one heating step. Although the imidization step takes place after a salt has been formed in the foregoing examples, the salt may not be necessarily formed in the present invention.

Although the resin compositions of the present invention are used to form a coating layer 16 of a flexible wiring board 10 in the foregoing examples, the present invention is not limited thereto but can be applied for forming resin films for various components such as copper-clad laminates.

After coating layer 16 is exposed and developed during the steps in FIGS. 2(a)–(c) described above, coating layer 16 may be washed with water, alcohol, acetone or the like to remove the developing solution from coating layer 16 before it is heated.

Although 4,4-methylenebis(cyclohexylamine) or 1,4-diaminocyclohexane is used as an alicyclic diamine in the foregoing examples, the present invention is not limited thereto but various alicyclic diamines can also be used such as 1,4-bis(aminomethyl)cyclohexane represented by chemical formula (21) below, 1,4-bis(3-aminopropyl)piperazine represented by chemical formula (22) below or 3,9-bis(3-aminopropyl)-2,4,8,10-tetraoxapyro[5,5]undecane represented by chemical formula (23) below.

Chemical formula (21)

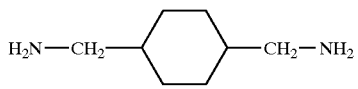

Chemical formula (22)

Chemical formula (23)

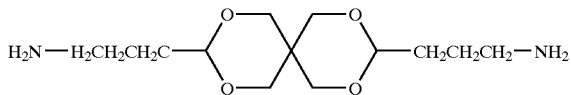

INDUSTRIAL APPLICABILITY

According to the present invention, precisely patterned resin films can be formed using photosensitive resin compositions.

What is claimed is:

1. A resin composition containing an imidized polyimide precursor having a polymer structure unit represented by formula (1) below:

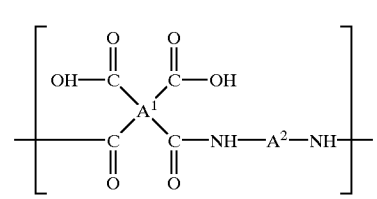

Formula (1)

wherein the chemical structure represented by $A^1$ includes an aromatic compound and the chemical structure represented by $A^2$ includes an alicyclic compound, and a photosensitizer, wherein the chemical structure represented by $A^1$ in formula (1) above is biphenyl represented by chemical formula (2) below:

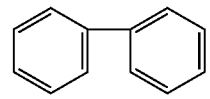

Chemical formula (2)

and the chemical structure represented by $A^2$ in formula (1) above is an alicyclic compound selected from either one of cyclohexane represented by chemical formula (3) below:

Chemical formula (3)

or 4,4'-methylenebiscyclohexane represented by chemical formula (4) below:

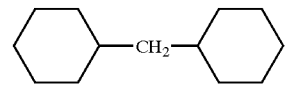

Chemical formula (4)

and wherein the polyimide precursor has an imidization degree of 7.5% or more and 36% or less as determined by equation (a) below:

$$(PS_1/PS_2)/(PI_1/PI_2) \times 100 \quad \text{Equation (a):}$$

wherein $PS_1$ and $PI_1$ represent the absorbances derived from the imide ring and $PS_2$ and $PI_2$ represent the absorbances derived from chemical structure $A^2$ in formula (1) above, and $PS_1$ and $PS_2$ represent the absorbances of the polyimide precursor to be tested for the imidization degree and $PI_1$, and $PI_2$ represent the absorbances of the polyimide precursor after complete imidization.

2. The resin composition of claim 1 wherein the photosensitizer is based on an o-quinone diazide compound represented by formula (5) below:

Formula (5)

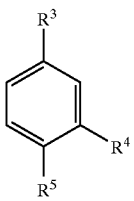

wherein substituent $R^3$ represents any one of substituents selected from the group consisting of methyl, hydroxyl, methylketone, cyano and the substituents represented by chemical formulae (6)–(8) below, substituent $R^4$ represents any one of substituents selected from the group consisting of hydrogen and the substituents represented by chemical formulae (6)–(8) below, and substituent $R^5$ represents any one of substituents selected from the group consisting of hydrogen and the substituents represented by chemical formulae (6)–(11) below, provided that at least one of substituents $R^3$–$R^5$ represents any one of substituents selected from the group consisting of the substituents represented by chemical formulae (6)–(8) below:

Chemical Formula (6)

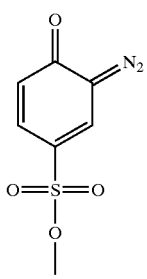

Chemical Formula (7)

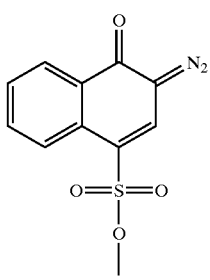

Chemical Formula (8)

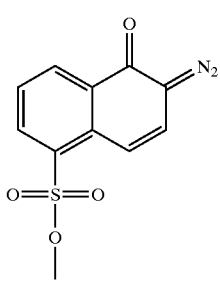

Chemical Formula (9)

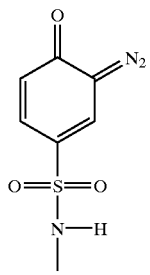

Chemical Formula (10)

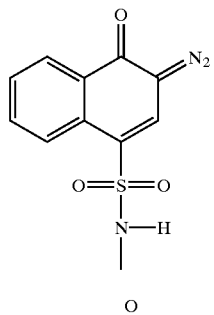

Chemical Formula (11)

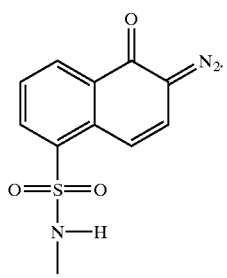

3. The resin composition of claim 1 wherein the photosensitizer is based on an o-quinone diazide compound represented by formula (12) below:

Formula (12)

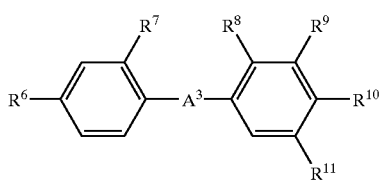

wherein chemical structure $A^3$ represents any one of chemical structures selected from the group consisting of oxygen, sulfonyl, ketone and the chemical structures represented by chemical formulae (13) and (14) below, and substituents $R^6$–$R^{11}$ represent any one of substituents selected from the group consisting of hydrogen, hydroxyl and the substituents represented by chemical formulae (6)–(11) below, provided that at least one of substituents $R^6$–$R^{11}$ represents any one of substituents selected from the group consisting of the substituents represented by chemical formulae (6)–(8) below:

Chemical Formula (13)

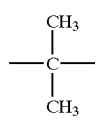

-continued

Chemical Formula (14)

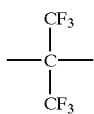

Chemical Formula (6)

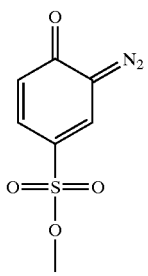

Chemical Formula (7)

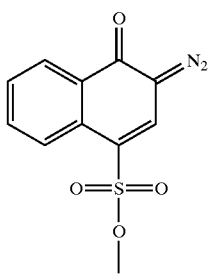

Chemical Formula (8)

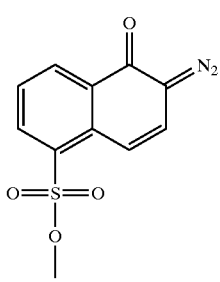

Chemical Formula (9)

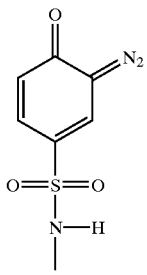

Chemical Formula (10)

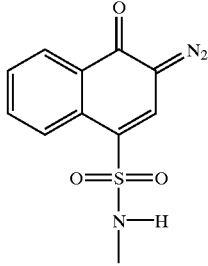

-continued

Chemical Formula (11)

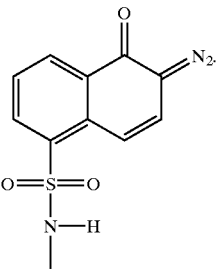

4. The resin composition of claim 3 wherein the o-quinone diazide compound is 2,3,4-trihydroxybenzophenone o-naphthoquinone diazide sulfonic ester represented by chemical formula (15) below:

Chemical Formula (15)

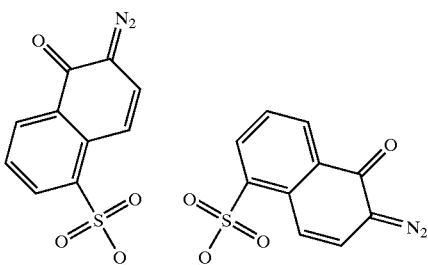

5. A process for forming a resin film comprising the steps of coating an object on which a resin film is to be formed with a resin composition containing a polyimide precursor having a polymer structure unit represented by formula (1) below and having an imidization degree of 7.5% or more and 36% or less and a photosensitizer to form a resin film, exposing the resin film to light to form a latent image, developing the resin film and heating the resin film to imidize the polyimide precursor, Formula (1)

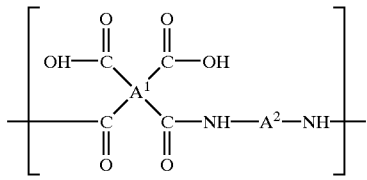

wherein the chemical structure represented by $A^1$ is biphenyl represented by chemical formula (2) below:

Chemical formula (2)

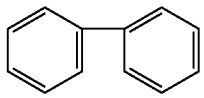

and the chemical structure represented by $A^2$ is an alicyclic compound selected from either one of cyclohexane represented by chemical formula (3) below:

Chemical formula (3)

or 4,4'-methylenebiscyclohexane represented by chemical formula (4) below:

Chemical formula (4)

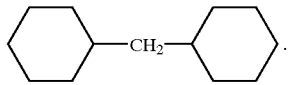

6. A process for preparing a resin composition comprising reacting 1,4-diaminocyclohexane represented by chemical formula (16) below:

Chemical formula (16)

with an aromatic dianhydride in a solvent to form a salt, reacting a resin solution containing the salt at a temperature of 80° C. or more and 150° C. or less, then reacting the resin solution at a temperature of 160° C. or more and 250° C. or less to a desired imidization degree and further adding a photosensitizer to the resin solution to give a resin composition.

7. A process for preparing a resin composition comprising reacting 4,4'-methylenebis(cyclohexylamine) represented by chemical formula (17) below:

Chemical formula (17)

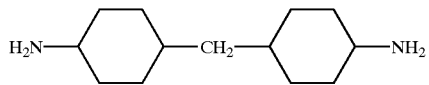

with an aromatic dianhydride in a solvent to form a salt, reacting a resin solution containing the salt at a temperature of 80° C. or more and 150° C. or less, then reacting the resin solution at a temperature of 160° C. or more and 250° C. or less to a desired imidization degree and further adding a photosensitizer to the resin solution to give a resin composition.

* * * * *